US008024682B2

(12) United States Patent
McConaghy et al.

(10) Patent No.: US 8,024,682 B2
(45) Date of Patent: Sep. 20, 2011

(54) GLOBAL STATISTICAL OPTIMIZATION, CHARACTERIZATION, AND DESIGN

(75) Inventors: Trent Lorne McConaghy, Beatty (CA); Pat Drennan, Gilbert, AZ (US); Joel Cooper, Saskatoon (CA); Jeffrey Dyck, Saskatoon (CA); David Callele, Saskatoon (CA); Shawn Rusaw, Saskatoon (CA); Samer Sallam, Saskatoon (CA); Jiangdon Ge, Saskatoon (CA); Anthony Arkles, Saskatoon (CA); Kristopher Breen, Saskatoon (CA); Sean Cocks, Saskatoon (CA)

(73) Assignee: Solido Design Automation Inc., Saskatoon (CA)

( * ) Notice: Subject to any disclaimer, the term of this patent is extended or adjusted under 35 U.S.C. 154(b) by 456 days.

(21) Appl. No.: 12/396,972

(22) Filed: Mar. 3, 2009

(65) Prior Publication Data

US 2009/0228846 A1 Sep. 10, 2009

Related U.S. Application Data

(60) Provisional application No. 61/033,078, filed on Mar. 3, 2008.

(51) Int. Cl.
*G06F 17/50* (2006.01)

(52) U.S. Cl. ........ 716/106; 716/100; 716/136; 716/113; 716/132; 716/102

(58) Field of Classification Search .................... 716/54, 716/100, 102, 108, 113, 132, 134
See application file for complete search history.

(56) References Cited

U.S. PATENT DOCUMENTS

| 7,669,150 B2 * | 2/2010 | Li et al. ..................... 716/132 |
| 2009/0083680 A1 * | 3/2009 | McConaghy et al. ............ 716/3 |

OTHER PUBLICATIONS

G. Gielen et al., Computer Aided Design of Analog Integrated Circuits and Systems, IEEE Press, Piscataway, 2002.
G. Gielen et al., Performance Space Modeling for Hierarchical Synthesis of Analog Integrated Circuits, Proc. Design Automation Conference (DAC), Jun. 13-17, 2005 pp. 881-886.
R. Rutenbar et al., Hierarchical Modeling, Optimization, and Synthesis for System-Level Analog and RF Designs, Proceedings of the IEEE 95(3), Mar. 2007. T. Eeckelaert et al., Efficient Multi-Objective Synthesis of Analog Circuits Using Hierarchical Pareto-Optimal Performance Hypersurfaces, Proc. Design Automation & Test Europe, 2005, pp. 1070-1075.
T. Eeckelaert et al., An Efficient Methodology for Hierarchical Synthesis of Mixed-Signal Systems with Fully Integrated Building Block Topology Selection, Proc. Design Automation & Test Europe, 2007.
T. McConaghy et al., Simultaneous Multi-Topology Multi-Objective Sizing Across Thousands of Analog Circuit Topologies, Proc. Design Automation Conference (DAC), 2007.

* cited by examiner

*Primary Examiner* — Vuthe Siek
*Assistant Examiner* — Brian Ngo
(74) *Attorney, Agent, or Firm* — Dennis R. Haszko

(57) ABSTRACT

For application to analog, mixed-signal, and custom digital circuits, a system and method to do: global statistical optimization (GSO), global statistical characterization (GSC), global statistical design (GSD), and block-specific design. GSO can perform global yield optimization on hundreds of variables, with no simplifying assumptions. GSC can capture and display mappings from design variables to performance, across the whole design space. GSC can handle hundreds of design variables in a reasonable time frame, e.g., in less than a day, for a reasonable number of simulations, e.g., less than 100,000. GSC can capture design variable interactions and other possible nonlinearities, explicitly capture uncertainties, and intuitively display them. GSD can support the user's exploration of design-to-performance mappings with fast feedback, thoroughly capturing design variable interactions in the whole space, and allow for more efficiently created, more optimal designs. Block-specific design should make it simple to design small circuit blocks, in less time and with lower overhead than optimization through optimization.

18 Claims, 16 Drawing Sheets

GLOBAL STATISTICAL OPTIMIZATION, CHARACTERIZATION, AND DESIGN

CROSS REFERENCE TO RELATED APPLICATION

This application claims benefit of priority of U.S. Provisional Patent Application No. 61/033,078, filed Mar. 3, 2008, which is incorporated herein by reference in its entirety.

The applicant acknowledges the participation of K.U. Leuven Research and Development in the development of this invention.

FIELD OF THE INVENTION

The present invention relates generally to multi-parameter designs (MPDs) and to tools used in selecting parameters of design variables of the MPD. The present invention particularly relates to analog, mixed-signal, and custom digital electrical circuit designs (ECDs) and to tools used in sizing devices of ECDs.

BACKGROUND OF THE INVENTION

Software tools are frequently used in the design of analog, mixed-signal and custom digital circuits. In front-end design-for-yield, designers must choose device sizes such that the maximum possible percentage of manufactured chips meet all specifications such as, e.g., gain greater than 60 B and a power consumption less than 1 mW. As such, the designers strive to maximize the yield of ECDs.

The design-for-yield problem of an ECD can easily include thousands of variables because there may be any number of devices in the ECD, each device having features of adjustable sizes, and being subject to any number of process variables, which are random in nature. The space of possible designs is very high as well, because there may be any number of design variables (variable dimensions or sizes) per device. Environmental variables such as, e.g., temperature and load conditions must be considered as well. Many of these effects can be simulated simultaneously in any suitable electronic circuit simulator such as, e.g., a Simulation Program with Integrated Circuit Emphasis (SPICE) software. However, the design problem is hard to decompose into simpler problems because the variables often have nonlinear interactions. All these variables impede a designer's ability to understand the issues affecting yield early in the design stage, and therefore his ability to choose device sizes that maximize yield.

In front-end design of ECDs, designers aim to choose a topology, i.e., devices such as transistors, and their associated sizes, according to pre-determined goals. In front-end design for yield, designers aim to set device sizes such that the maximum possible percentage of manufactured chips meets all performance specifications (i.e., maximize yield). Designers may even wish to further improve the ECD by increasing the margin of performance from specifications, e.g., by maximizing process capability (Cpk). A variety of tools can help the designer in achieving these goals. Such tools include simulators, schematic editors, optimizers, characterizers, and design environments.

Circuit simulators such as, e.g., a SPICE program, are typically used to estimate a design's performances, yield, and/or Cpk. Schematic editors offer a means for the designer to enter the topology into SPICE with visual feedback. Optimization tools, also known as optimizers, can automatically try out different device sizes and obtain feedback from estimations of circuit performance and yield from, for example, circuit simulation runs, and report the best designs to the user. Characterization tools, also known as characterizers, can gather and present, through a display module, ECD information to the user to aid his insight into the problem and, as such, allow the designer to seize opportunities for the design. Such characterization information can calculate the relative impact of design variables on yield, performance metrics as a function of design variable, or any other suitable characteristic value of the ECD. A design environment is a tool that can incorporates together other design tools, but its core characteristic is that it provides the designer a means to manage and try out different designs as efficiently and effectively as possible. The design environment thus serves, among other things, as a designer feedback and input tool. One way for the designer to choose circuit device sizes is to use a software-based optimization tool such as, for example, those described in *Computer-Aided Design of Analog Integrated Circuits and Systems*, R. Rutenbar, G. Gielen, and B. Antao, eds., IEEE Press, Piscataway, 2002. With feedback from a display module, the user sets up the optimization problem, invokes an optimization run, and monitors progress and results that get reported back via a database. Such a tool, whether applied ECDs or to multi-parameter designs (MPDs), incorporates an optimization algorithm that traverses the space of possible designs, obtains feedback about a cost function associated to candidate designs of the ECD (or MPD) through one or more simulators, or physical measurements, and returns the lowest-possible cost designs within finite time (e.g., overnight) and computer resource constraints (e.g., 5 CPUs available).

Optimization of ECDs can be challenging. The time required to simulate a single design point (also referred to as a candidate design, which includes a set of sizes attributable to devices of the ECD) at a single process corner/environmental point can take minutes or more. To estimate yield for a single design using Monte Carlo simulation can involve hundreds or more random samples from a process joint probability distribution function (jpdf). Further, simulations at several environmental points for each process point can be required. Therefore simulation can extend beyond several hours. This hinders the applicability of yield optimization using naïve Monte Carlo sampling (e.g., where the optimizer's cost function is −1.0*yield) because it would allow only a highly limited number of candidate designs to actually be examined within a reasonable time period. There are other challenges too: the cost function is generally a blackbox, which means that it is possibly nonconvex, possibly non-differentiable (and without easy access to derivatives), and possibly non-continuous. Such characteristics preclude the use of existing optimization algorithms that could otherwise take advantage of those properties. In other word, it is not possible to use algorithms that exploit numerous simplifying assumptions.

Similarly problems in yield optimization, or robust design, or stochastic optimization, exist in many technical fields beyond that of ECDs. In fact, such problems exist in almost any engineering field in which parameterizable design problems exist, for which simplifying assumptions cannot be made, and which have means of estimating a design's cost functions such as with a dynamical systems simulator. Such technical fields include, amongst others, automotive design, airfoil design, chemical process design, and robotics design.

A locally optimal design is one that has lower cost than all its immediate neighbors in design space. By contrast, a globally optimal design is one in which no other designs in the whole space are better. A robust optimization problem can be classified into global or local optimization, depending on whether a globally optimal solution is desired (or at least targeted) or, a locally optimal solution is sufficient. A convex mapping is one in which there is only one locally optimal design in the whole space, and therefore it is also the globally optimal design. Conversely, a nonconvex mapping means that there are more than one locally optimal designs in design space. The present disclosure is more related to problems in which convex mappings cannot be assumed, because they need more than local search algorithms to solve. Over the years, a wide variety of global blackbox algorithms have been developed, such as, for example, simulated annealing algorithms, evolutionary algorithms, tabu search, branch & bound algorithm, iterated local search, particle swarm optimization, and variants thereof. Local search algorithms are very numerous too and include, for example, Newton-method derivatives, gradient descent, derivative-free pattern search methods, etc.

In the field of yield optimization for transistor-precision circuits, most approaches make simplifying assumptions (e.g., by assuming linearity of constraints, or by modeling circuit performances with manually-set equations rather than simulation), or reduce the scope of the problem (e.g., by doing only local yield optimization rather than full global yield optimization, or by optimizing only on a few design variables rather than potentially hundreds). There is no approach that can do full global yield optimization on hundreds of variables with no simplifying assumptions.

With respect to ECD characterizers, there are just a few approaches that allow, but only in part, to capture and display mappings of design variables to performance metrics across the whole design space. One approach is merely to specify a center design point (center candidate design), and then to do a sweep of one or more design variables about that center design point, followed by simulating at each swept point. This is followed by displaying a circuit response as a function of a given variable's value, such as power versus w1 (width of transistor 1). This can be done for one or several corners, which have values for process and environmental points, e.g., nominal process point at a typical temperature and power supply setting, or for 50 Monte Carlo samples of process points on 3 environmental corners each. As an example, with 40 Monte Carlo samples, a graph can show as the ordinate, statistical estimators such as yield, Cpk, or average value of a response (e.g. average power) with abscissa showing on of the circuit's variable. Of course, the ordinate can include several responses at once too.

A simplified version of this approach is merely perturbation analysis, in which for each design variable there are just one or two swept values with small perturbations from the center design variable point. These sweep approaches are good in that they give the user intuition of the circuit's response as a variable is changed. However, a major issue is that variable interactions are not captured. This can be a problem since interaction between design variables often matter in circuit design (i.e., circuit design problems are not linearly separable). A related approach is to sweep two design variables in all their combinations, to obtain a grid of candidate designs, then to simulate and display the response such as with a surface or contour plot. This can capture interactions of two variables at a time and give interesting insights. However, if there are N variables then there would be an order $N^2$ interactions to simulate on a grid and plot, which can be prohibitively expensive. Furthermore, such a method ignores interactions of more than two variables. Additionally, the resolution of the grid would have a large effect on the number of simulations. For example, 5 values per variable would imply 25 samples (probably reasonable) for each two-variable interaction but is not enough resolution to be interesting, but a higher resolution of 10 samples per variable means 100 samples (probably unreasonable) for each two-variable interaction.

A third approach is to do space-filling sampling in the design variable range of interest, to simulate at those samples, build regression models which map design variables to performances (or yield, Cpk, etc) then, for two-dimensional and three-dimensional plots, to simulate off the model itself. The benefit of this latter approach is that it can capture interactions between design variables. It can also handle a large number of variables (hundreds or more) if the range of each variable is very small, or it can handle a broad ranges of design variables if there are few design variables (e.g. <10). However, the approach performs abysmally when the number of design variables is large and the range of each design variable is large. That is, the regression models capture the true mapping poorly because the mapping is highly nonlinear. More training samples are limited in the help they can provide because simulation time is not negligible. There is an upper bound on the number of simulation samples, typically 10,000 to 100,000, that can be for a larger circuit.

Another approach which tries to make better use of the simulation samples is called an active-learning approach in which only some samples and simulations are taken to start with, models are built in accordance with the samples and simulation, and then more samples and simulations are taken from the models' regions of highest uncertainty. The loop is then repeated. Unfortunately, these approaches introduce massive overhead in continual rebuilding of models, and the final models are often inaccurate. Finally, it is unclear how to incorporate statistical awareness into these characterization approaches in a general way. For example, for model-building approaches, adding process variables can imply a ten-time increase in the number of variables, which can be prohibitive when the number of input variables for a model has a strong impact on its ability to predict. The challenge that remains for characterization of MPD's, and ECD's in particular, is to capture and display mappings from design variables to performance, across the whole design space (where there can be hundreds of design variables), in reasonable time (e.g., in less than one day), in reasonable number of simulations (e.g., in less than 100,000 simulations), and including capturing design variable interactions, and other possible nonlinearities. Ideally, if the characterizer has uncertainties in its mappings, it would report these explicitly (and as intuitively as possible).

Existing circuit design environments have means for the user (designer) to invoke single-variable sweeps, perturbation analysis, two-variable grid sweeps, model-building characterization runs, optimization runs, and to get corresponding plots out. In communication with the design environments, are one or more circuit simulators. There is also, typically means to manually change design variable values, e.g. by typing new design variable values into a dialog box. Such circuit design environments have issues because the user cannot quickly get insight into the whole design at once. That is, if the user wants to understand the effect of sweeping one or more variables he has to invoke simulations, and wait for the responses. There is also the risk of obtaining candidate designs for local optima during design because the user may inadvertently focus on locally optimal regions, not knowing that better design regions of design variables space. In sum, current design environments' functionality for trying new designs has feedback, and the feedback offered is partial at best, causing inefficient and possibly suboptimal design.

In ECDs, there are many sorts of circuit types that are commonly reused, from differential pairs and current mirrors up to operational amplifiers, to name a few. Especially in the smallest blocks (also referred to as sub-blocks), designers find themselves spending considerable time finding the right sizes for the design, despite having designed such blocks possibly dozens or even hundreds of times before. The reason they keep redesigning these smallest blocks is that there can be slight variations in the ECD design problem. For example, different manufacturing processes can give rise to different transistor models; there can be different environmental conditions such as lowering power supply voltages; and there can be different specifications such as lowering power consumption targets. Furthermore, each block has a context within an ECD that can give rise to slightly different DC operating points. As such, continually redesigning such trivial circuits takes time, which could be better spent on more challenging design tasks if there were a means to design such sub-blocks more quickly. Optimizers can be used but the designer typically doesn't know exactly what specifications they want for each tiny block, and there is a tradeoff that can be explored before the user knows what he wants. Additionally, setting up an optimization (single- or multi-objective) can be more time-consuming than it would take the designer to just size the block or sub-block manually.

Therefore, it is desirable to provide four tools: global statistical optimization (GSO), global statistical characterization (GSC), global statistical design (GSD), and block-specific design. GSO should do global yield optimization on hundreds of variables with no simplifying assumptions. GSC should capture and display mappings from design variables to performance: across the whole design space, handle hundreds of design variables, in reasonable time (say <1 day), in reasonable number of simulations (say <100,000), capture design variable interactions and other possible nonlinearities, explicitly capture uncertainties and intuitively display them. GSD should support the user's exploration of design-to-performance mappings with fast feedback, thoroughly capturing design variable interactions in the whole space, and allow for more efficiently created, more optimal designs. Block-specific design should make it trivial to design small circuit blocks, in a fashion that is palatable for designers (e.g. with less time & overhead than optimization).

SUMMARY OF THE INVENTION

In a first aspect of the invention, there is provided a method to optimize a multi-parameter design (MPD) having design variables and performance metrics. The method comprises the following steps. (a) Calculating, at a first set of design corners, a performance value of each performance metric for each candidate design of a first set of candidate designs. Each performance metric is a function of at least one of the design variables. The design variables define a design variables space. The MPD has associated thereto the first set of candidate designs, random variables, defining a random variables space, and environmental variables, defining an environmental variables space. The random variables space and the environmental variables space define design corners at which the candidate designs can be evaluated. Each candidate design represents a combination of design variables. (b) Calculating, for each performance value, a performance value uncertainty. The performance value of each performance metric for each candidate design of the first set of candidate designs, and its respective performance value uncertainty, define a first set of data. (c) In accordance with the first set of data, building a model of each performance metric to obtain a first set of models. Each model maps at least one design variable to a model output and to a model output uncertainty. (d) Storing the first set of models in a characterization database. (e) Displaying, for selection, one or more models of the first set of models, and their model uncertainty. (f) In response to a selection of one or more candidate designs, which defines selected candidate designs, and in accordance with the one or more displayed models, performing the following steps. (i) Adding the selected candidate designs to the first set of candidate designs, to obtain a second set of candidate designs. (ii) Calculating, at a second set of design corners, a performance value, and a performance value uncertainty, for each performance metric of each selected candidate design. (iii) Adding the performance value, the performance value uncertainty of the selected candidate designs to the first set of data, to obtain a second set of data. (iv) In accordance with the second set of data, modifying the model of each performance metric, to obtain a second set of models, each having a modified model uncertainty. (v) Displaying, for inspection, one or more models of the second set of models. (vi) In accordance with the second set of candidate designs, and in accordance with pre-determined search rules, generating additional candidate designs by performing a search of the design variables space. The search is biased towards optimality and uncertainty of the performance metrics. (vii) Adding the additional candidate designs to the second set of candidate designs, to obtain a third set of candidate designs. (viii) calculating, at a third set of design corners, a performance value, and a performance value uncertainty, for each performance metric of each additional candidate design. (ix) Adding the performance value and the performance value uncertainty of the additional candidate designs to the second set of data, to obtain a third set of data; and (x) in accordance with the third set of data, modifying the model of each performance metric and the model uncertainty of each model, to obtain a third set models. Subsequently, the step (g), displaying, for inspection, one or more models of the third set of models, is performed.

The method can further comprise a step of generating random candidate designs, and the step of generating additional candidate designs can also in accordance with the random candidate designs.

The step of performing the search of the design variables space can include a step of performing an automated optimization of the performance metrics in the design variables space, with the optimization being performed in accordance with pre-determined optimization criteria.

The automated optimization can include optimizing a cost function, with the cost function depending on at least one of the performance metrics, the pre-determined optimization criteria including an optimum cost function value.

The automated optimization can include steps of forming an active learning model (ALM) for each performance metric, and performing a multi-objective optimization in accordance with the ALMs, with objectives of the multi-objective optimization being functions of the models' performance metric values and of the models' uncertainties in performance metric values.

At least one of the first set of models, the second set of models, and the third set of models can include at least one regressor. The at least one regressor can include at least one of: ensembles of linear models, ensembles of polynomials, ensembles of piecewise polynomials, ensembles of splines, ensembles of feedforward neural networks, ensembles of support vectors, ensembles of kernel-based machines, ensembles of classification and regression trees, and ensembles of density estimations.

The step of displaying the one or more models of the first, second or third sets of models and their related uncertainty can includes displaying the one or more models of the first set of models and their related uncertainty in a graphical form or in a text form.

The graphical form can include a two-dimensional plot of a performance metric model, and its related uncertainty, as a function of a design variable. The related uncertainty can include a lower confidence bound and an upper confidence bound.

The step of displaying one or more models of the first, second and third sets of models can be a graphical plot of one design variable versus a second design variable versus a performance metric model's value.

The graphical plot can include at least one of a contour map and a three-dimensional surface plot. The method can further include steps of identifying within a graph, designs that meet performance constraints; and identifying within the same graph, designs that fail to meet performance constraints.

The method can further comprise steps of calculating an impact of a portion of the design variables on a characteristic of the MPD, in accordance with any one of the first, second and third set of data; and displaying the impact of the portion of the design variables on the characteristic. The characteristic can be a manufacturing yield of the MPD.

The step of calculating at any one of the first, second, and third set of design corners can include automatically simulating the MPD at the respective set of design corners.

Advantageously, the step of performing the search of the design variables space can include a user (also referred to as a designer) creating new candidate designs. The user can create new candidate designs by having a "current design" and selecting a performance metric to plot and a design variable to plot. Then, the user examines a graphical two-dimensional plot of a performance metric model's value, and its related uncertainty, as a function of one design variable where all other design variables have the value the current design. Subsequently, the user choose a new value for selected design variable, creates a new CD based on the new value of the design variable, and sets the other design variable values to those of the "current design". The user can select a design variable to plot, given a performance metric, by examining the relative impacts of design variables on the performance metric, in the form of a bar plot or table and then clicking on the bar plot or table entry corresponding to the design variable of interest. Further, the user can click on the bar plot or table entry corresponding to the design variable of interest, and the graphical two-dimensional plot of performance metric model's value and uncertainty, versus the newly-selected design variable, can be automatically plotted. The user can choose a new value for the design variable by clicking on the plot of performance metric value and uncertainty, versus the design variable, to have the new design variable's value corresponds to the design-variable value on the plot where the user had clicked.

As further advantages, the user can create new candidate designs by having a "current design", selecting a performance metric to plot and two design variables to plot, and examining a graphical plot of a performance metric model's value as a function of two design variables where all other design variables have the value the current design. The user can then choose a new value for either or both selected design variable, then create a new CD based on the new value of those design variables and set the other design variable values to those of the "current design".

The advantages can be accomplished in accordance with a flow such as: 1. the designer chooses "current metric"=highest impact metric, using a performance metric impact bar plot; 2. the designer chooses "current design variable"=highest impact design variable on "current metric", using a design variable impact bar plot; 3. a system auto-plots "current performance metric" vs. "current design variable", using performance models not simulations; 4. the designer chooses "current metric value"=the value of "current design variable" that gets the value of the model's "current metric" as close as possible to its specification value, without making other model metric values infeasible; 5. if all metric values are feasible, the flow is stopped; 6. if all performance metrics have been tried, the flow is stopped; 7. if "current metric value" is feasible, designer sets "current metric"=next-highest-impact metric, and goes to step 2; 8. if all design variables have been tried for this metric, designer sets "current metric"=next-highest-impact metric and goes to step 2; 9. the designer sets "current design variable"=next-highest-impact design variable on "current metric", and goes to step 3.

Other advantages provided by the present invention include the ability of the user to click on a design variable presented in a design variable impact plot, to automatically plot, in two-dimensions, a performance metric model, and its related uncertainty, as a function of the selected design variable. Further, the user can click in the two-dimensional plot to set cause the current design to take on the selected variable value (the one selected by clicking). The same advantages can be provided though the plotting of a contour map or a three-dimensional surface plot.

In a second aspect of the invention, there is provided a method to optimize a multi-parameter design (MPD) having design variables and performance metrics. The method comprises the following steps. (a) Calculating, at a first set of design corners, a performance value of each performance metric for each candidate design of a first set of candidate designs. Each performance metric is a function of at least one of the design variables. The design variables define a design variables space. The MPD has associated thereto the first set of candidate designs, random variables, defining a random variables space, and environmental variables, defining an environmental variables space, the random variables space and the environmental variables space defining design corners at which the candidate designs can be evaluated. Each candidate design represents a combination of design variables. (b) Calculating, for each performance value, a performance value uncertainty, the performance value of each performance metric for each candidate design of the first set of candidate designs, and its respective performance value uncertainty, defining a first set of data. (c) In accordance with the first set of data, building a model of each performance metric to obtain a first set of models. Each model maps at least one design variable to a model output and to a model output uncertainty. (d) Storing the first set of models in a characterization database. (e) Displaying, for selection, one or more models of the first set of models, and their model uncertainty. And, (f) in response to a selection of one or more candidate designs, which defines selected candidate designs, and in accordance with the one or more displayed models performing the steps: (i) Adding the selected candidate designs to the first set of candidate designs, to obtain a second set of candidate designs. (ii) Calculating, at a second set of design corners, a performance value, and a performance value uncertainty, for each performance metric of each selected candidate design. (iii) Adding the performance value, the performance value uncertainty of the selected candidate designs to the first set of data, to obtain a second set of data. (iv) In accordance with the second set of data, modifying the model of each performance metric, to obtain a second set of models, each having a modified model uncertainty; and (v) displaying, for inspection, one or more models of the second set of models.

In a third aspect of the invention, there is provided a computer-readable medium having recorded thereon statements and instructions for execution by a computer to carry out a method to optimize a multi-parameter design (MPD) having design variables and performance metrics. The method comprises the following steps. (a) Calculating, at a first set of design corners, a performance value of each performance metric for each candidate design of a first set of candidate designs. Each performance metric is a function of at least one of the design variables. The design variables define a design variables space. The MPD has associated thereto the first set of candidate designs, random variables, defining a random variables space, and environmental variables, defining an environmental variables space. The random variables space and the environmental variables space define design corners at which the candidate designs can be evaluated. Each candidate design represents a combination of design variables. (b) Calculating, for each performance value, a performance value uncertainty. The performance value of each performance metric for each candidate design of the first set of candidate designs, and its respective performance value uncertainty, define a first set of data. (c) In accordance with the first set of data, building a model of each performance metric to obtain a first set of models. Each model maps at least one design variable to a model output and to a model output uncertainty. (d) Storing the first set of models in a characterization database. (e) Displaying, for selection, one or more models of the first set of models, and their model uncertainty. (f) In response to a selection of one or more candidate designs, which defines selected candidate designs, and in accordance with the one or more displayed models, performing the following steps. (i) Adding the selected candidate designs to the first set of candidate designs, to obtain a second set of candidate designs. (ii) Calculating, at a second set of design corners, a performance value, and a performance value uncertainty, for each performance metric of each selected candidate design. (iii) Adding the performance value, the performance value uncertainty of the selected candidate designs to the first set of data, to obtain a second set of data. (iv) In accordance with the second set of data, modifying the model of each performance metric, to obtain a second set of models, each having a modified model uncertainty. (v) Displaying, for inspection, one or more models of the second set of models. (vi) In accordance with the second set of candidate designs, and in accordance with predetermined search rules, generating additional candidate designs by performing a search of the design variables space. The search is biased towards optimality and uncertainty of the performance metrics. (vii) Adding the additional candidate designs to the second set of candidate designs, to obtain a third set of candidate designs. (viii) calculating, at a third set of design corners, a performance value, and a performance value uncertainty, for each performance metric of each additional candidate design. (ix) Adding the performance value and the performance value uncertainty of the additional candidate designs to the second set of data, to obtain a third set of data; and (x) in accordance with the third set of data, modifying the model of each performance metric and the model uncertainty of each model, to obtain a third set models. Subsequently, the step (g), displaying, for inspection, one or more models of the third set of models, is performed.

There present disclosure relates to four complementary design tools that can be used in the field of multi-parameter design, which includes electrical circuit design. These design tools include (1) an optimization tool that can perform automated sizing across an entire, pre-determined design variables space; (2) a characterization tool that can, among other things, capture and display mappings from design variables to performance metrics across the whole design space; (3) a design environment tool that can, among other things, allow the designer to quickly try new designs based on feedback from the characterization tool; and (4) and a block-specific tool which allows quick re-use of commonly-used design blocks. In this disclosure, the design tool builds on the characterization tool, which builds on the optimization tool. The block-specific tool is an instantiation of the design tool, but for a particular portion of the MPD.

The present invention is related to tools for global statistical optimization (GSO), global statistical characterization (GSC), global statistical design (GSD), and "block-specific tools" which meet the challenges outlined above, such that they can be applied to a broader range of circuit design problems, including analog, mixed-signal or custom digital circuit design problems.

GSO is enabled by a combination of complementary techniques which allow it to do global yield optimization on hundreds of variables with no simplifying assumptions: corners not statistics, "structural homotopy" (defined later), and model-building optimization including biases to regions of optimality and uncertainty.

GSC builds on GSO by using GSO's samples and simulations, and because it uses GSO it explicitly biases for both optimality and uncertainty (unlike past techniques which either do not bias at all, or bias for just uncertainty). With this more aggressive bias, GSC can adequately model the regions of design space that the user finds interesting. It ensures that models mapping design variables to performances or cost are available to the user; and sweeps, 2d plots, etc based on the models are available as well. Relative impacts of different variables on different outputs is also useful.

GSD leverages the new visualizations offered by GSC within the context of an interactive design environment. The characterization info of GSC can be reframed as "design guidance" information within GSD that gives insight with quick feedback. For example, impact & sweep information etc can now be viewed as which variables to change, and how to change their values, in order to improve the design. Furthermore, GSD closes the design loop by offering a means for the user to try new design points out, and quickly get feedback about them.

"Block-specific tools" in the present disclosure use the interactive environment of GSD, and are enabled by GSC. But it is applied to smaller circuit blocks, blocks with so few variables that one can apply simpler sampling techniques for the design variables (and other variables), such as full factorial sampling from the design of experiments (DOE) literature. Databases are typically stored for convenient reuse multiple times later, within the context of designing larger blocks.

Even GSO databases from larger circuits cand be generated once and stored, to save the designer time, such as commonly used operational amplifiers. A repository of databases for different topologies and technologies could be built up over time. In fact, this directly leads to a hierarchical design methodology, in which GSC databases from sub-blocks can be used for generating the GSC databases of parent blocks. The process of creating GSC databases for ever-larger blocks continues upwards until the top-level block, at which point the top-level design is completed.

The present invention provides a method of capturing the mappings from design variables to performance(s) or cost function(s) via active learning in which the bias to new sample points incorporates both (a) uncertainty and (b) optimality. The method can do optimization, e.g. by minimizing cost function(s).

The present invention also provides a method of capturing the mappings from design variables to performance(s) or cost function(s) via active learning in which new sample points are periodically generated by random sampling in the space, and other sample points are generated by optimization operators.

The present invention also provides characterization or design environment, which uses regression models that map design variables to performance(s) or cost function(s). Most of the variables can be across a broad region of the design variable space and the mapping accounts for variable interactions. There can be a means for the user to select one or more variables, which are subsequently "current selected variables". There can be bar plots which differentiate design variables, such as providing variables "impacts" or other rankings on performance(s) or cost function(s), and the user can interact with the bar plots to select one or more variables(s), e.g. via clicking, ctrl-click, shift-click etc. There can be an underlying "current design point". If one variable is selected, a plot can be displayed which shows >=1 selected performance(s) or cost function(s) on the y axis and the variable on the x-axis (one 2d sweep plot, or one 2d sweep plot for each performance). There is a means for the user to select/change the performances or cost functions. If two or more variables are selected, then a plot can be displayed which shows a contour/surface/etc 3d plot, where the x and y axes are the first two design variables selected, and the z-axis is the selected performance or cost function. If more than one performance or cost function is selected then multiple plots may be shown simultaneously. There is a means for the user to select/change the performances or cost functions. The user can have a means to easily simulate the "current design point" on one or more corners. The user can have a means to easily do simulations that sweep across the selected design variable on one or more corners, with other values set to "current design point". The results can be reported on the sweep plot, comparing the model's response and the simulation response.

Further, the user can have a means to easily do simulations across a 2d grid of two selected design variables on one or more corners, with other values set to "current design point". The user can have a means to easily do other analyses on the "current design point", such as Monte Carlo sampling. The user can click on the sweep plot, and that can cause a change of the value of the x-variable of the sweep plot in the "current design point".

The user can click on the plot (e.g. contour plot), and that can cause a change of the two design variables in the plot in the "current design point". The user can have a means to easily change all values of the "current design point" to a "suggested design point" which is the point that can be found by optimizing on the regression models to minimize cost etc.

The samples for training the regression models can come from the method of capturing the mappings from design variables to performance(s) or cost function(s) via active learning in which the bias to new sample points incorporates both (a) uncertainty and (b) optimality. The samples for training the regression models can come from method of capturing the mappings from design variables to performance(s) or cost function(s) via active learning in which new sample points are periodically generated by random sampling in the space, and other sample points are generated by optimization operators. The samples for training the regression models can come from an optimizer that explores the design space globally. The optimizer can be such that it solves a yield optimization problem.

Further, the models and/or training data for models, and possibly other data can be stored in any suitable type of database.

Further still, other users can simultaneously use the characterization or design environment, which uses regression models that map design variables to performance(s) or cost function(s) via a shared database. Furthermore, the optimizer can suggest designs to the user(s). The samples for training the regression models can come from an experimental design such as full-factorial, fractional factorial, Latin Hypercube, etc. The user(s) can have a means to analyze the performance tradeoff. The user(s) can use the performance tradeoff visualization to set a "current design point".

The present invention also provides a method of optimization in which different versions of an optimization problem are all solved simultaneously, each with a different degree of loosening of the true optimization problem. There is a means to promote designs from looser optimization problems to tighter optimization problems. The loosest optimization problem periodically can get periodically injected with fully-random design points. Some of the new design candidates are generated by leveraging some form of model-building optimization. The number of "corners" determines how loose the optimization problem is; where a corner includes values for manufacturing process variables, environmental variables, and/or other uncontrollable variables. The samples for training the regression models come from the method of optimization in which different versions of an optimization problem are all solved simultaneously, each with a different degree of loosening of the true optimization problem. There can be a means to promote designs from looser optimization problems to tighter optimization problems.

The present invention also provides systems to implement the methods of the present invention.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

There present invention relates to four complementary design tools that can be used in the field of MPD, which includes ECD. These design tools include (1) an optimization tool that can perform automated sizing across an entire, pre-determined design variables space; (2) a characterization tool that can, among other things, capture and display mappings from design variables to performance metrics across the whole design space; (3) a design environment tool that can, among other things, allow the designer to quickly try new designs based on feedback from the characterization tool; and (4) and a block-specific tool which allows quick re-use of commonly-used design blocks. In this disclosure, the design tool builds on the characterization tool, which builds on the optimization tool. The block-specific tool is an instantiation of the design tool, but for a particular portion of the MPD.

Generally, the present disclosure provides a method and system for global statistical optimization (GSO), global statistical characterization (GSC), global statistical design (GSD), and block-specific tools. GSD builds on GSC, which builds on GSO (or DOE for small blocks). The invention is applicable to electrical circuit design (ECD) but also to other fields involving multi-parameter design.

Figure 1:
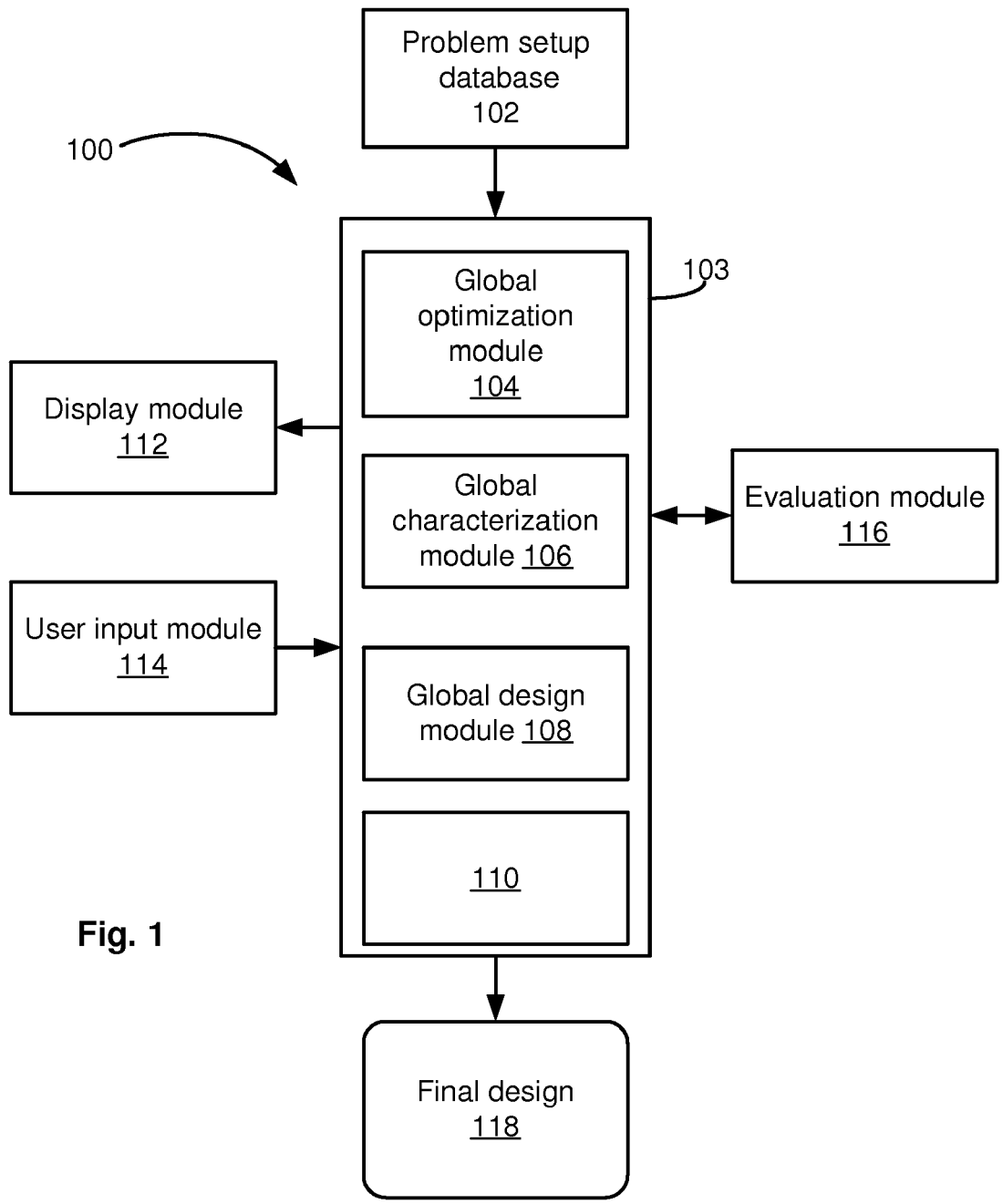
FIG. 1 shows a exemplary generic system of the present invention.

FIG. 1 shows an exemplary system 100 of the present invention, used in optimizing a MPD. The system 100 includes a problem setup module and database 102 that includes particulars of the MPD to be optimized, as well as problem setup data. The problem setup database 102 is in communication with a group of modules 103 that includes a global optimization module 104, a global characterization module 106, a global design module 108, and, optionally, other modules 110, such as, for example, a Monte Carlo sampling module. A display module 112 is in communication with the group of modules 103, which can be controlled by a designer through a user input module 114 that can include a keyboard, a pointing device, and/or any other suitable type of input devices. The designer interacts with the group of modules 103 (also referred to as a set of tools) which collectively are used to create, analyze, size, and/or optimize the MPD. The group of modules 103 takes as input the problem setup database 102, which can also be used to store results that can be used as input to future MPDs. The global optimization module 104, can be used to carry out global optimization. As will be understood by the skilled worker, the global optimization module 104 can be replaced, for simple MPDs, with a design of experiments module. Global optimization is achieved in concert with the evaluation module 116 that evaluates candidate designs of the MPD at design corners (i.e., at various process and/or environmental points). A designer (or a team of designers) can interact with the group of modules 103 through the user input module, and receive feedback from the group of modules 103, through the display module 112. The final output of the system 100 can include one or more sized designs 118, a simulation results database, and/or a characterization results database, which can all be stored in the problem setup database 102. As stated above, the system 100 can be used in relation to MPDs such as ECDs, and can also be used in, for example, chemical process design, and mechanical design. Further, as will be understood by the skilled worker, the system 100 can be used in non-statistical design as well.

Figure 2:
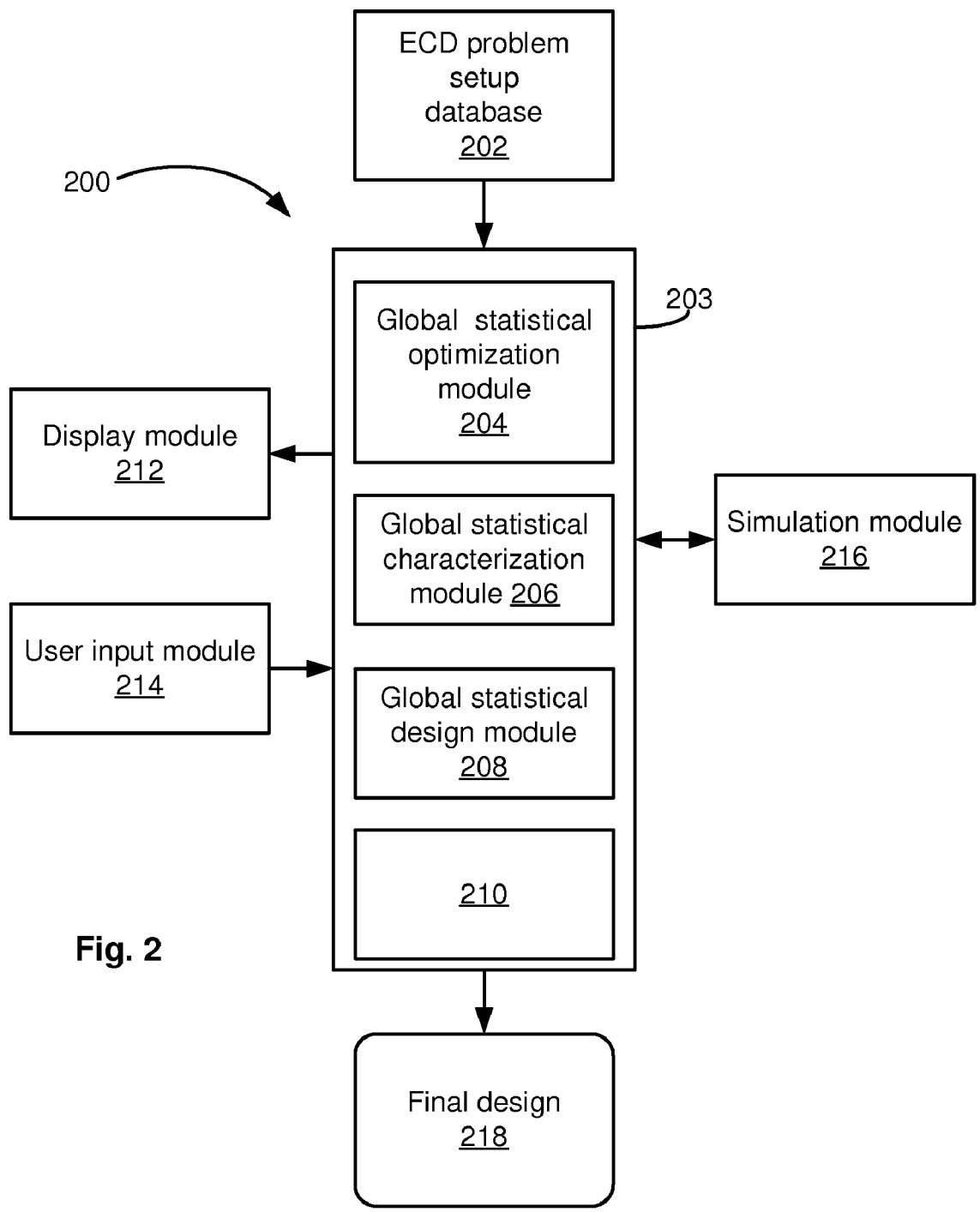
FIG. 2 shows an exemplary system of the present invention, as applicable to statistical design of ECDs.

FIG. 2 shows a system 200, which is an instantiation of the system 100 of FIG. 1, specifically for statistical design of large circuit blocks (e.g., large ECDs). The system 200 has a group of modules 203 that includes a global statistical optimization (GSO) module 204, a global statistical characterization (GSC) module 206, a global statistical design (GSD) module 208, and, optionally, other design related modules 210, which can include, for example, schematic editors, simulation waveform viewers, and Monte Carlo samplers The GSC module 206 can output a GSC models of the ECD to the ECD problem setup database 202. The models (e.g., regressors) can map design variables to any one of performance metrics, feasibility, yield, Cpk, and cost functions. The system 200 also includes an ECD problem setup module and database 202 and a simulation module 216.

The ECD problem setup database 204 can include: circuit topology specifications (e.g., as a schematic or a netlist), and bounds of the design variables space with the bounds typically depending from process variables. The bounds of design variables space specify values the ECD topology's devices can take. The ECD problem setup database 204 can also include an initial sizing for the topology, that is, an initial set of design variables, which can be referred to as an initial candidate design (CD). The ECD problem setup database 204 can also have test harnesses each including circuit analyses, possible environmental points—or bounds on environmental variables—at which to simulate CDs of the ECD. The ECD problem setup database 204 can also include, amongst others, a procedure as to how to measure pre-determined performance metrics (e.g., how to measure power consumption); constraints (or pre-determined performance metric criteria) for each performance metric (e.g., power consumption less than 1 mW); device models (e.g., MOS model files); and a random joint probability density function (jpdf) of process parameters to model manufacturing variation, or at least a way to draw random points from the jpdf, even if the jpdf itself is not directly accessible. When a simulation of an ECD CD is performed, resulting information gets stored in the ECD problem setup database 202. For example, the output from the GSC module 206 get stored in the ECD problem setup database 202. Other intermediate information can get stored in the ECD problem setup database 202, possibly based on interactions with the user. Sized designs and/or design corners can also be stored in the ECD problem setup database 202. A database in the present disclosure does not necessarily imply a full-fledged relational database supporting advanced queries; it could merely be a collection of files residing in a set of directories possibly across several machines. Additionally, in the context of the present disclosure, a tool that does sampling (a sampler) is a tool that chooses a set of simulations and invokes them, in order to gather more information about a specified circuit sizing (also referred to as a CD).

The simulation module 216 can perform specified analyses on a given CD of an ECD, at specified process points and environmental points, using a specified test harness. The circuit topology of an ECD is composed of circuit devices (e.g., resistors, MOS transistors, or even larger building blocks with specified behavior, such as, for example, operational amplifier (op amp) models), and the interconnections (wires) between the devices of the ECD. The topology can also include extra components from parasitic extraction of a layout. The test harness includes more devices and interconnections, plus energy sources (e.g., oscillating voltage), and means of measurement (e.g., probes on given nodes and/or mathematical formulae that ultimately output scalar values of ECD performance). The simulation module 216 typically solves one or more sets of differential equations as part of its analysis. In the context of circuit design software, SPICE simulators refer to a particular class of simulators that are very popular.

Figure 3:
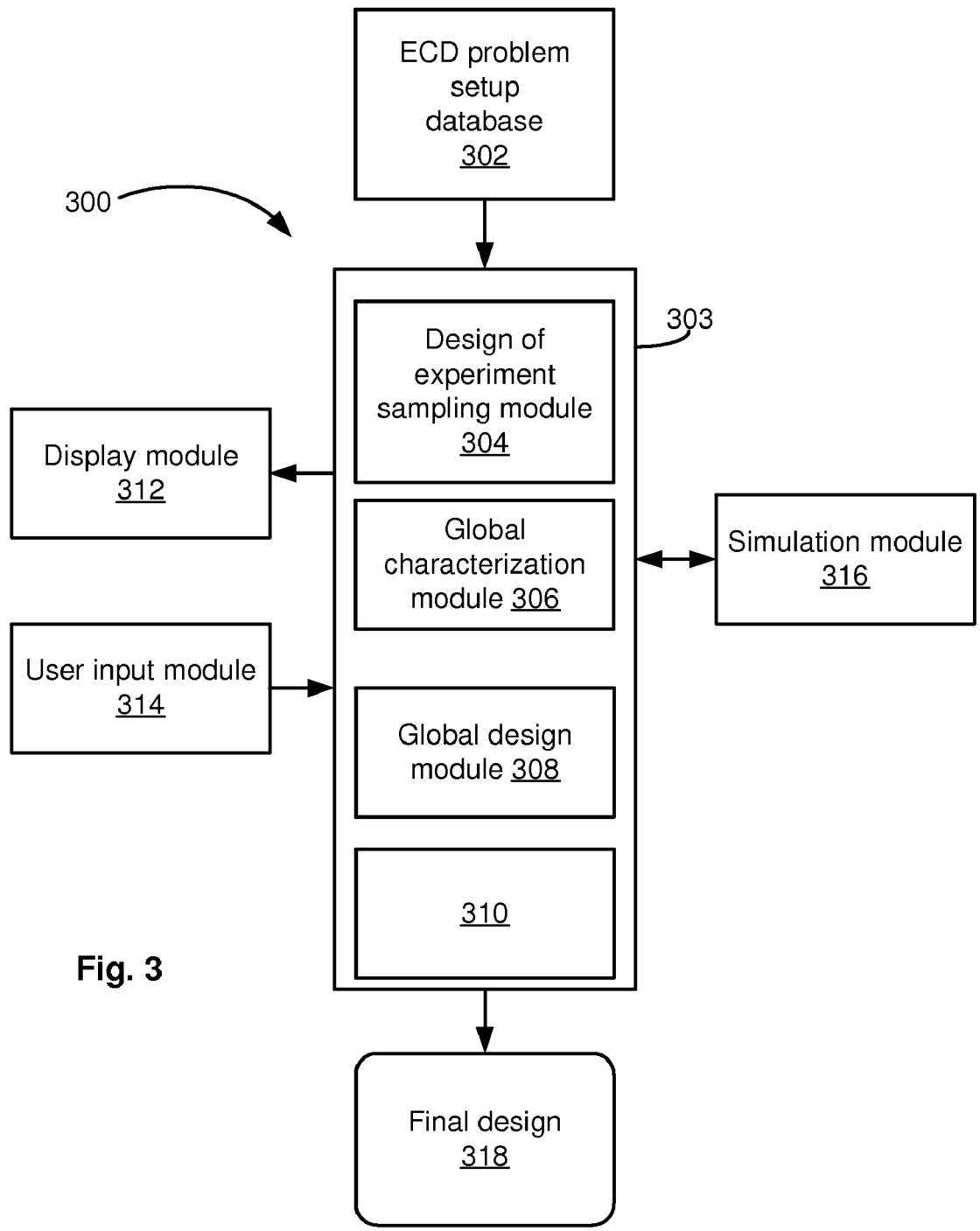
FIG. 3 shows an exemplary system of the present invention for small block-specific tools.

FIG. 3 shows a system 300, which is an instantiation of the system 100 of FIG. 1, specifically for design of smaller blocks (designs). In smaller blocks, there are fewer design variables and, as such, the adaptive/complex heuristics of GSO are not necessarily needed; instead, design of experiment (DOE) sampling can be done. DOE sampling can include, for example, full-factorial design, fractional-factorial design, Monte Carlo sampling from a uniform distribution, and Latin Hypercube sampling from a uniform distribution. Typically the DOE will aim to be space-filling. That is, to have points in the design variables space that have good spread between each other (substantially equidistributed points). If there are, with respect to the MPD, uncontrollable variables such as statistical (process) variables or environmental variables, these can be accounted for in any suitable manner. One option is to include those uncontrollable variables as part of the DOE sampling space. Another option is to choose a set of representative corners in uncontrollable variables space, and then, for each DOE sample in design-variable space, to evaluate at all the corners. The DOE approach can be applied up to blocks for which it becomes infeasible to generate enough samples to build a good model unless feedback is invoked (e.g., feedback in the form of GSO). As will be understood by the skilled worker, GSO can be used on small blocks as well, but the GSO complexity is not typically necessary.

Figure 4:
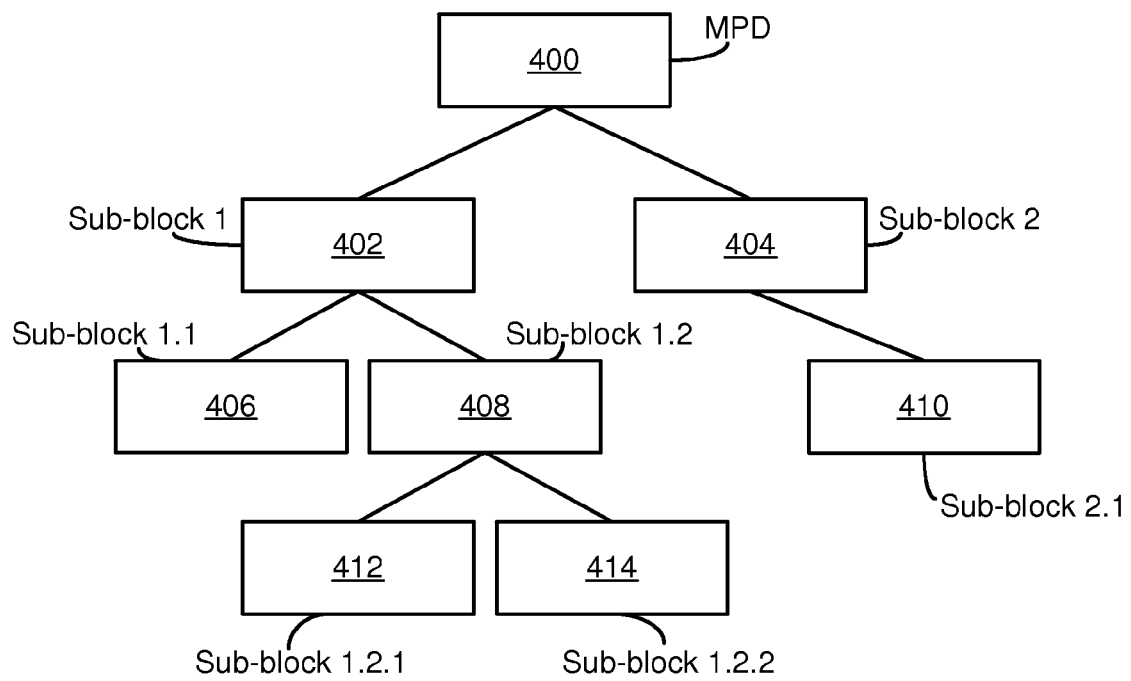
FIG. 4 shows a hierarchical organization of blocks in a design.

Most real-world MPDs have sufficient complexity such that designing all the sub-blocks (or sub-designs) of an MPD at once is practically infeasible due to the large number of MPD design variables to consider at once and/or the long evaluation time for the whole MPD. Instead, designs tend to be hierarchically decomposed, where sub-blocks (and sub-sub-blocks, etc) are designed and combined into an overall MPD, as shown at FIG. 4 where an exemplary MPD 400 includes sub-blocks 1 and 2 (402, 404). Sub-block 1 (402) includes sub-block 1.1 and 1.2 (406, 408). Sub-block 1.2 (408) includes sub-blocks 1.2.1 and 1.2.2 (412, 414). As for sub-block 2 (404), it is shown as including sub-block 2.1. This type of system-level design, or hierarchical design, is described in the article by G. Gielen, T. McConaghy, T. Eeckelaert, *Performance space modeling for hierarchical synthesis of analog integrated circuits*, in Proc. Design Automation Conference (DAC), pp. 881-886, Jun. 13-17, 2005; and in the article by R. Rutenbar, G. Gielen, J. Roychowdhury, *Hierarchical Modeling, Optimization, and Synthesis for System-Level Analog and RF Designs*, Proceedings of the IEEE 95(3), March 2007.

There are many possible "hierarchical design methodologies" that can be followed in order to realize an overall MPD, with various mixes of top-down traversal, bottom-up traversal, and problem refinement. For example, if it is possible to model feasible regions of all sub-blocks, then a top-down constraint-driven (TDCD) flow (method) can be used in which the top-level block (e.g., block 400 of FIG. 4) is designed to meet specifications first, which is equivalent to setting specifications of each sub-block. Subsequently, each sub-block is designed to meet its respective specifications. This is equivalent to setting the sub-sub-blocks' specifications. And so on for sub-sub-blocks. In many applications, including analog circuit design, feasible regions are not known beforehand. As such, an approach to model the MPD (an ECD in this case) is through bottom-up feasibility modeling (BUFM) in which lowest-level classification models of feasibility are automatically generated, and those classification models are propagated upwards. The problem with BUFM is that it has never been demonstrated to scale to a large number of design variables. A purely bottom-up flow would design lowest-level blocks first, then incorporate those designs into the next-highest level, repeating until the top level is reached. For example, in the article by T. Eeckelaert, T. McConaghy and G. Gielen, *Efficient Multiobjective Synthesis of Analog Circuits Using Hierarchical Pareto-Optimal Performance Hypersurfaces*, Proc. Design Automation & Test Europe (DATE), 2005, pp. 1070-1075, a multi-objective bottom-up (MOBU) flow performs multi-objective optimization at the lowest-level blocks, then uses the tradeoff of results as the only available designs for the next level up.

MOBU is practical in that it relies less on the scalability of classification approaches; however, it has drawbacks that include: (1) in many cases, there are so many objectives that generating a full tradeoff across the whole design space is extremely time-consuming; (2) some specifications have a target "range" but not maximum or minimum values; and (3) it is unclear how to incorporate such range goals into the context of a multi-objective optimizer. A variant of MOBU is an approach where, at some nodes, multi-objective optimization on more than one MPD topology is performed. The resulting Pareto-optimal sets (tradeoffs of results) are then merged into one overall Pareto-optimal set (e.g., see the article by T. Eeckelaert, R. Schoofs, G. Gielen, M. Steyaert, W. Sansen, *An Efficient Methodology for Hierarchical Synthesis of Mixed-Signal Systems with Fully Integrated Building Block Topology Selection*, Proc. Design Automation & Test Europe (DATE), 2007).

Another variant is where, at some nodes of the MPD, a multi-objective optimization is performed where the search space includes more than one topology. That is, design variables are not just device sizes but also topological choices as disclosed in the article by T. McConaghy, P. Palmers, G. Gielen, M. Steyaert, *Simultaneous Multi-Topology Multi-Objective Sizing Across Thousands of Analog Circuit Topologies*, Proc. Design Automation Conference (DAC), 2007. Further, a variant that combines ideas of MOBU and FMBU is to peform TDCD/FMBU but to let the MOBU performance tradeoffs define the optimal performance bounds of feasibility region in FMBU; the performance bounds for opposite directions (e.g., maximize power) are left open.

Figure 5:
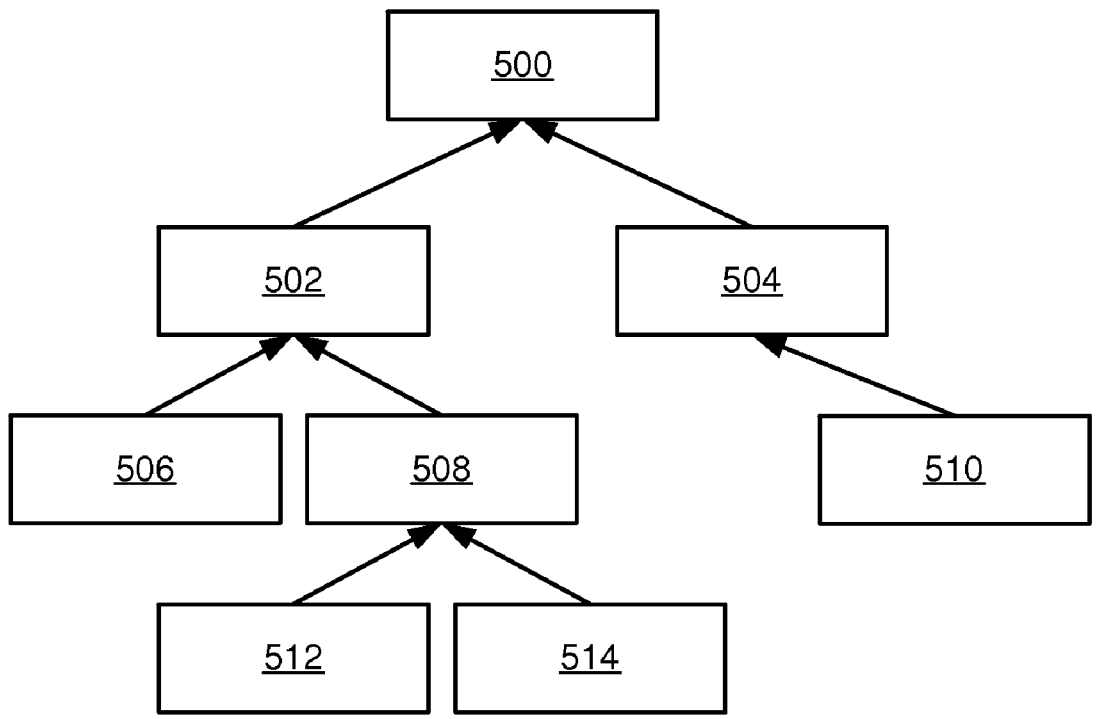
FIG. 5 shows an example of how hierarchical design can be accomplished bu upwards propagation of GSC databases.

The GSO, GSC and GSD modules (204, 206, and 208) of the present disclosure can be used in many varieties of hierarchical design methodologies, with top-down or bottom-up aspects. As disclosed above, and as is described in more detail below, output from the GSC module 206 includes mappings (models) from design variables to performance metrics, feasibility, cost, etc. of the MDP. Accordingly, lower sub-blocks of an MPD can be optimized/characterized first (or determined before optimization begins) and the resulting GSC mapping (models) propagated upwards toward the next sub-block, using the mappings during optimization to bypass lower-level simulations. As will also be disclosed in more detail below) this can also allow for further refinement of lower-level GSC databases during higher-level global statistical optimization, characterization, and design. FIG. 5 shows how such GSC mapping (models) of sub-blocks 502, 504, 506, 508, 510, 512, and 514 propagate from lower sub-blocks to the actual overall MPD 500.

Figure 6:
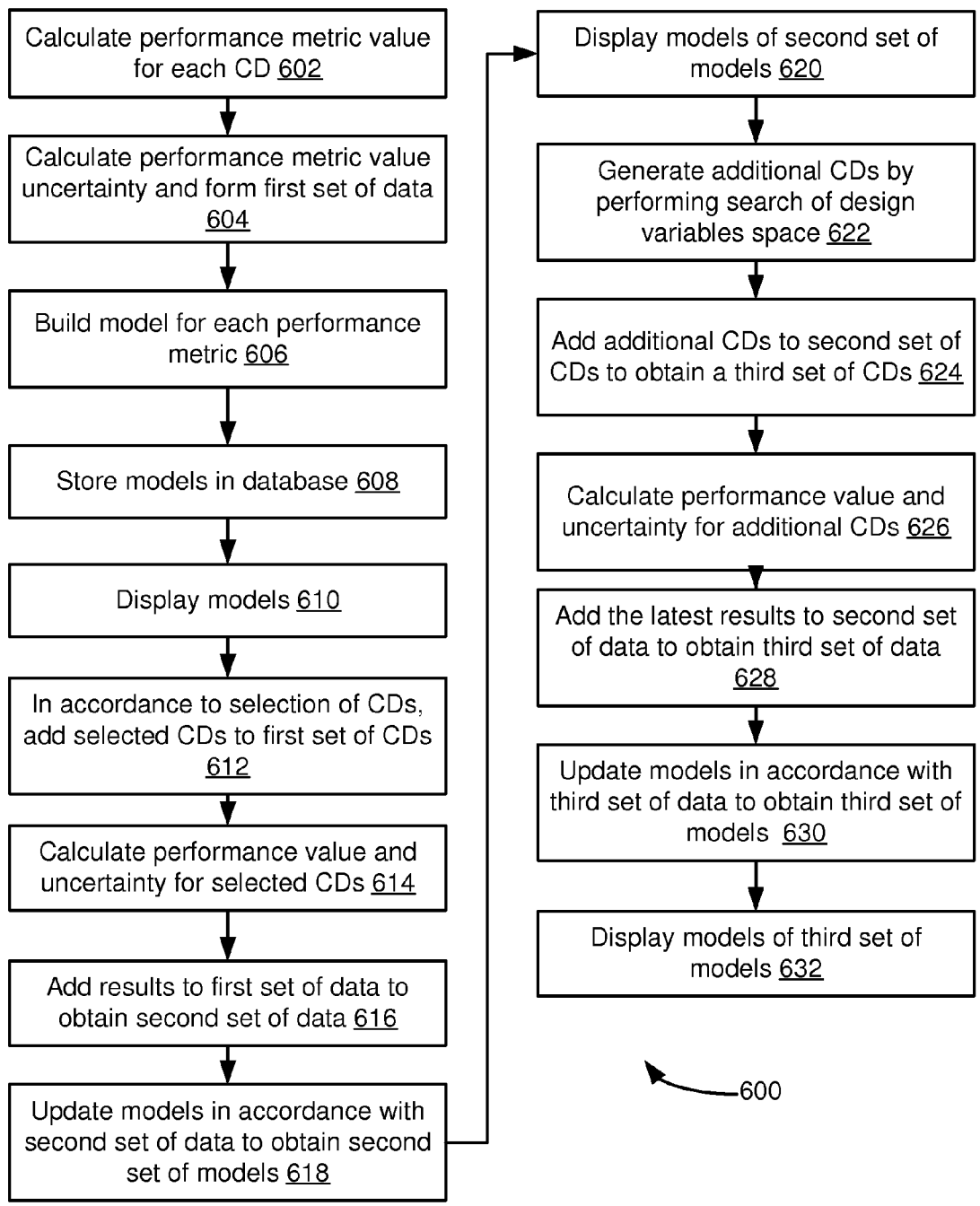
FIG. 6 shows a flowchart of an exemplary method of the present invention.

FIG. 6 shows an exemplary method 600 of how GSC mappings can be obtained, in the context of optimizing a MPD. The method of FIG. 6 optimizes a MPD having design variables and performance metrics. Each performance metric is a function of at least one of the design variables. The design variables define a design variables space. The MPD has associated thereto a first set of CDs, random variables, which define a random variables space, and environmental variables, that define an environmental variables space. The random variables space and the environmental variables space define design corners at which the CDs can be evaluated. Each CD represents a combination of design variables.

At step 602, at a first set of design corners, a performance value of each performance metric for each CD of the first set of CDs is calculated. At step 604, for each performance value, a performance value uncertainty is calculated. The performance value of each performance metric for each CD of the first set of CDs, and its respective performance value uncertainty, define a first set of data. At step 606, in accordance with the first set of data, a model of each performance metric is built to obtain a first set of models. Each model maps at least one design variable to a model output, and to a model output uncertainty. Alternatively, instead of building models for the performance metrics, models for any suitable cost function of the MPD, or models for other characteristics of the MPD (e.g., yield, partial yield, etc.) can be built.

At step 608, the models are stored in a characterization database, which can be a problem setup database, a dedicated GSC database, or any other suitable type of database. At step 610, the models, or a portion thereof, and their respective model uncertainty are displayed, for selection, in any suitable format. At step 612, in response to a selection of one or more CDs (which defines selected CDs) carried out in accordance with the one or more displayed model, the selected CDs are added to the first set of CDs, to obtain a second set of CDs. At step 614, a performance value, and a performance value uncertainty, for each performance metric of each selected CD, are calculated at a second set of design corners. At step 616, the performance value, and the performance value uncertainty of the selected CDs are added to the first set of data, to obtain a second set of data.

Subsequently, at step 618, in accordance with the second set of data, the model of each performance metric is modified (updated), to obtain a second set of models, each of the modified models has a modified model uncertainty. This is followed at step 620, by displaying, for inspection, the second models, or a portion thereof.

Following this, at step 622, in accordance with the second set of CDs, additional candidate designs are generated by performing a search of the design variables space, with the search being biased towards optimality and uncertainty of the performance metrics. The search is performed in accordance with pre-determined search rules. The biasing in the search can be accomplished, through any suitable means towards CDs that optimize the performance metrics of the MPD and maximize the uncertainty of the performance metrics. For example, the biasing can include identifying, in design variables space, a direction in which the optimality of performance metric of a CD improves while the uncertainty of the performance metric decreases, and then selecting a CD along the identified direction. In the case where the models relate to cost function or other MPD characteristics (e.g., manufacturing yield), then the optimization can be performed to optimize these other functions or characteristics, and to maximize their uncertainty.

Subsequently, at step 624, the additional CDs are added to the second set of CDs, to obtain a third set of CDs. At step 626, at a third set of design corners, a performance value, and a performance value uncertainty, are calculated for each performance metric of each additional CD. At step 628, the performance value and the performance value uncertainty of the additional CDs are added to the second set of data, to obtain a third set of data. At step 630, in accordance with the third set of data, the model of each performance metric and the model uncertainty of each model are modified (updated), to obtain a third set models. At step 632, one or more models of the third set of models are displayed for inspection.

As will be understood by the skilled worker, the models obtained throughout the method 600 are biased towards optimality and uncertainty. This is because of the underlying search of additional CDs also biases towards optimality and uncertainty. As will also be understood by the skilled worker, the exemplary method 600 of FIG. 6 allows a designer to gain insight into the MPD he is designing, and to achieve a final MPD design more rapidly than through prior art methods. This is achieved by displaying, to the user, models of performance metrics of the MPD. The designer can then select CDs in accordance to interesting regions of displayed models. The selected CDs are then used to update the displayed models and to generate additional CDs, through, e.g., the GSO module 204 of FIG. 2. The additional CDs are generated through a search algorithm that aims to optimize the performance metrics and maximize uncertainty. This allows for a thorough and rapid exploration of the design variables space.

As will be further understood by the skilled worker, additional CDs can be constantly generated by, e.g., the GSO module 204, while the user considers the displayed models, which can be updated in real-time as the GSO module 204 generates additional CDs. This has for effect of displaying updated models having a model uncertainty that decreases as more additional CDs are generated. The improving accuracy of the displayed models allows the designer to gain better insight as more and more of these additional CDs are generated.

As will be understood by the skilled worker, the models can include regressors, which can include ensembles of linear models, ensembles of polynomials, ensembles of piecewise polynomials, ensembles of splines, ensembles of feedforward neural networks, ensembles of support vectors, ensembles of kernel-based machines, ensembles of classification and regression trees, and ensembles of density estimations.

The following describes further implementations of the present disclosure. For use in TDCD/BUFM design, mappings (models) form the GSC 206 can be used as bottom-up feasibility models. The mappings are able to scale because they not only bias to the model's feasibility boundary but they also bias for uncertainty and optimality. Once the feasibility models (mappings) are created, they can be used in TDCD sizing as well. Further, GSC sub-models (e.g., the models of sub-blocks 502-514 of FIG. 5) can be refined whenever requested from higher-level nodes.

As will be understood by the skilled worker, GSO, GSC, and GSC can also be used in the multi-objective bottom-up (MOBU) flow described above, though due to the nature of MOBU, the GSC databases would not be propagated; instead just the tradeoffs would be propagated as usual and the exemplary system of FIG. 2 could serve as a design tool at each node.

Figure 7:
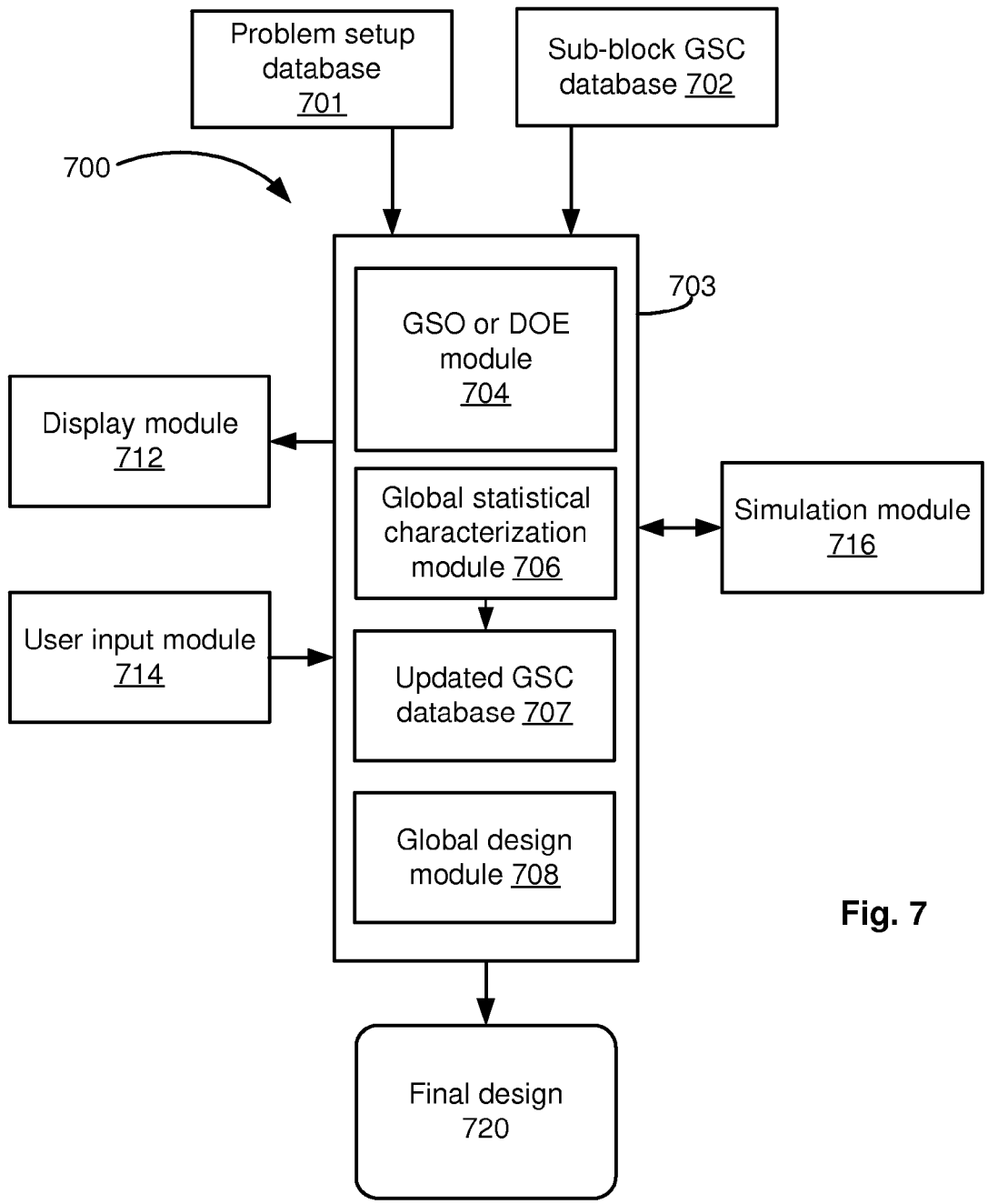
FIG. 7 shows how at a given node in a hierarchy of blocks, the GSC database and/or sized design(s) can be created via a combination of GSO/DOE, GSC, and GSD involving the designer.

FIG. 7 shows an approach to design at a hierarchical node which fully leverages GSO (or DOE), GSC, and GSD. The input is the node's problem setup database 701, and GSC databases 702 from sub-blocks (if any). Each sub-block's GSC database has a mapping of design variables to feasibility, and this classifier is used to constrain the overall block's design space. The GSC database 702 can offer some ways to speed up estimation of performance of candidate designs in the case where there are behavioral models ("reduced dynamic macro-models", such a disclosed in the article by R. Rutenbar, G. Gielen, J. Roychowdhury, Hierarchical *Modeling, Optimization, and Synthesis for System-Level Analog and RF Designs*, Proceedings of the IEEE 95(3), March 2007) for sub-blocks which are parameterized by target performances. In this case, the design variables space for each sub-block can be merely the chosen specifications subject to the feasibility classifiers. The GSC database 702 can also speed up estimation when the design space for each sub-block is set to be the lowest-level design variables in the block (e.g. transistor widths). Estimation of the sub-block's performances is then performed by simulating the sub-block's GSC's regressor on the low-level design variables; possibly in conjunction with a behavioral model parameterized by target performances. Further, the GSC database 702 can speed up estimation by way of, for each GSC database 702, including behavioral models which are parameterized by design variables, such that an approximate simulation of the MPD would be simulating each sub-block's behavioral model.

Regardless of if, or how, the sub-blocks' GSC databases 702 speed up performance estimation, GSO/DOE proceeds at the level of the design. The designer interacts with the group of modules 703 through the user input module 714 with the goal of getting good final design(s) 720. During that process, the new GSC database 707 are created and updated. Some of the sub-blocks' GSC databases 702 can be updated too, e.g. after requests for finer-resolution information. Once complete at a given node, the design process can be repeated at nodes higher in the hierarchy. There is another variant of the approach described in relation to FIG. 7, in which all nodes are designed at once rather than following a hierarchical traversal, and the emphasis of the algorithm then shifts to focusing only on overall regions which are promising in terms of optimality and/or uncertainty. A prerequisite for such a flow is to be able to explicitly model the uncertainty in the mappings from design variables to performance metrics, feasibility, cost, MPD characteristics, etc.

Figure 8:
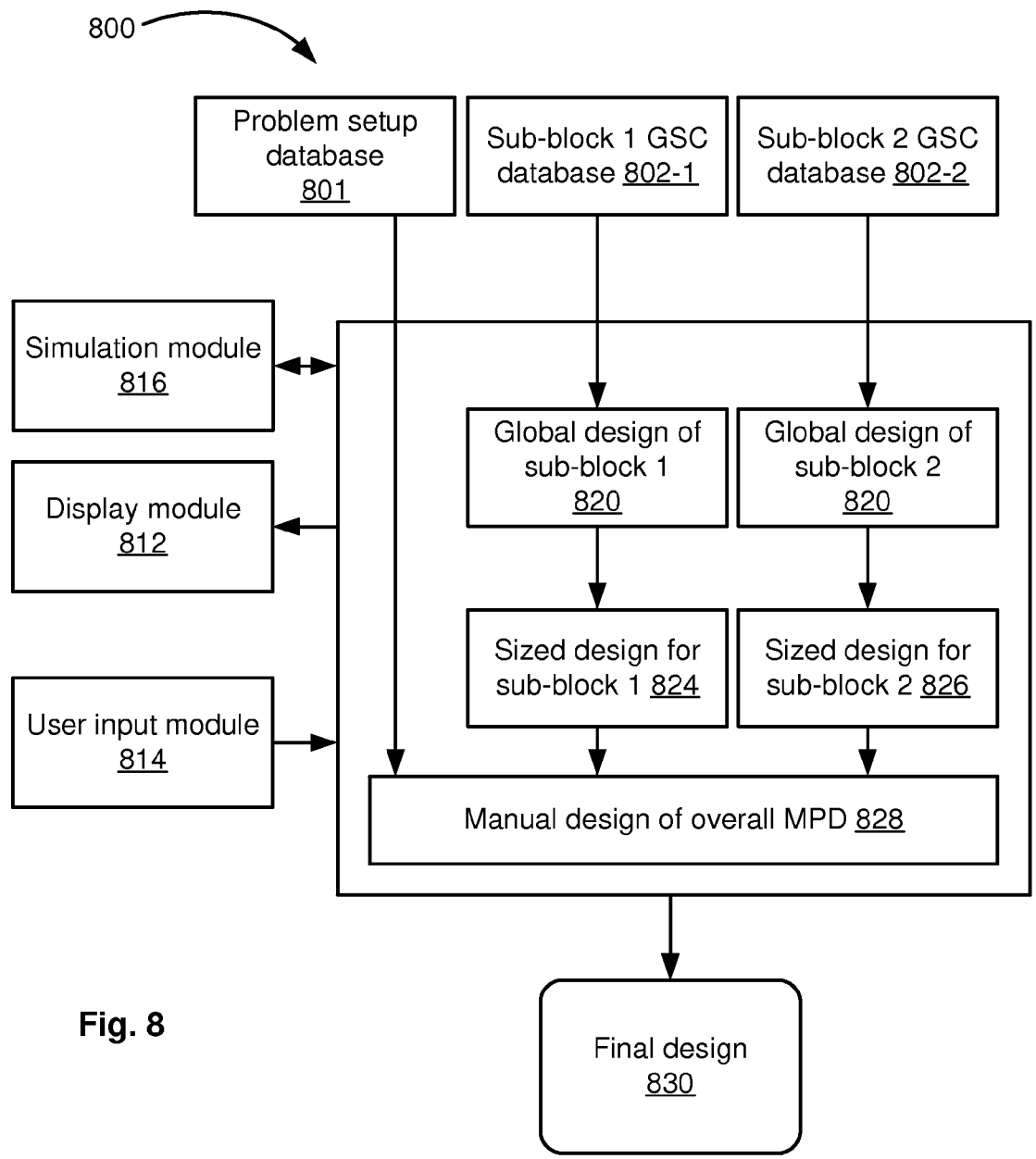
FIG. 8 shows how at a given node in the hierarchy of blocks, sized design(s) can be created by using sub-blocks' GSC databases but without GSO/DOE or GSD at the node itself.

FIG. 8 shows a system 800 by which an approach to design at a hierarchical node can be implemented. The approach depicted in relation to FIG. 8 supports a fully-manual flow. The input GSC databases 802-1 and 802-2 contain pre-determined mappings (models) of performance metrics, cost, or characteristics of sub-blocks 1 and 2 of an exemplary two sub-block MPD. A typical usage is to have pre-determined databases for common circuit blocks such as, e.g., current mirrors and differential pairs. The inputs to of the system 800 are the problem setup database 801 and sub-block GSC databases 802-1 and 802-2. For each sub-block of the MPD, a designer uses the system 800, in particular the design module 828, on that sub-block's database to choose design variable values for the each sub-block. The values are then exported into the MPD (or ECD) itself. The context of the sub-block within the MPD can affect the output of the system 800 for sub-blocks. For example, if the ECD is an op amp, while viewing the op amp schematic, the user may select some of its devices that comprise a current mirror "CM1". Subsequently, the user may invoke a "start block tool" command, which opens up the system 800 of the current mirror, subject to the load and bias conditions that the op amp has imposed on it. The designer uses the design module 828 to select sizes for the current mirror, then exports the current mirror's design to the CM1 devices within the operation amplifier. The designer can then select other devices in the op amp, which comprise a different current mirror, "CM2", and repeat using the system 800 to set its sizes. The designer could also repeat this for a bias generator block and a differential pair block, or any other sub-block of the ECD (or MPD). The invocation of the system 800 for selected devices can cause the system 800 to automatically know what the selected device is, based on basic knowledge of how topological connections relate to different block types. A GSC database is not generated at the level of the node, so any higher-level nodes in the hierarchy cannot use propagation of GSC databases.

In the case where the designer invokes the system 800 for a sub-block but there is currently no GSC database for that sub-block, the designer could choose to generate such a database on the fly by any suitable method such as active learning or DOE. Interestingly, this invokes an aspect of top-down design, illustrating that hierarchical flows can sometimes mix. Once the designer has used the system 800 for each sub-block of the MPD or ECD, he has effectively chosen reasonable initial values for each of the MPD's blocks. At this point, the designer can do further manual tuning of the design, typically with feedback from the simulator module 716. Note that he could also use this initial design as input to an optimizer as well.

Figure 9:
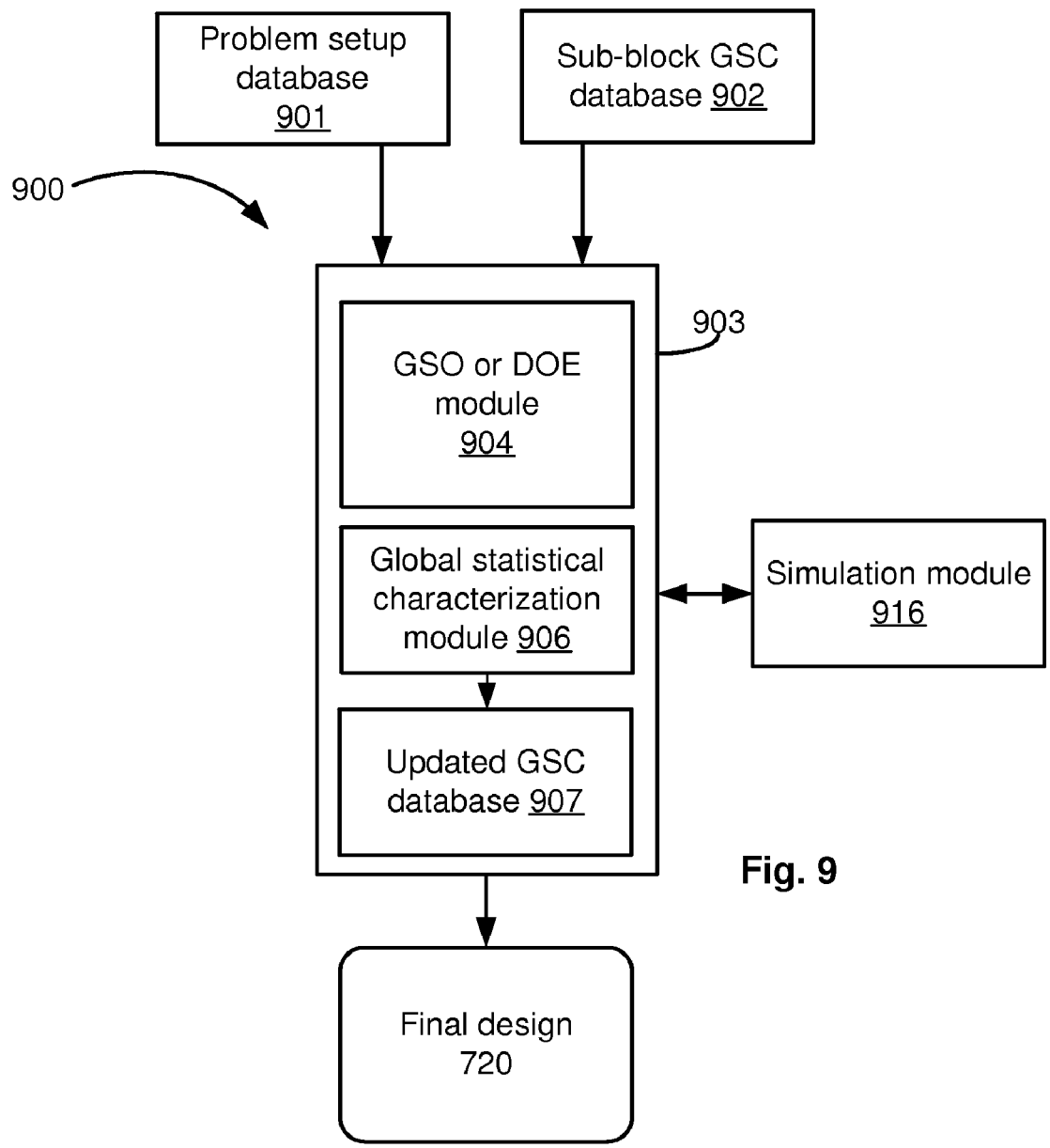
FIG. 9 shows how at a given node in the hierarchy of blocks, the GSC database and/or sized design(s) can be created in a fully automated fashion.

FIG. 9 illustrates an approach to design at a hierarchical node which is fully automatic. It can be considered to be just like FIG. 7, except without user interaction. What is interesting about this approach is that because it is fully automatic, it can be combined with an automatic traversal of the whole design hierarchy (or a subtree), thereby allowing fully automatic design of the whole hierarchy (or a subtree) at once. Sub-blocks' GSC databases may be updated (refined) during this process.

Figure 10:
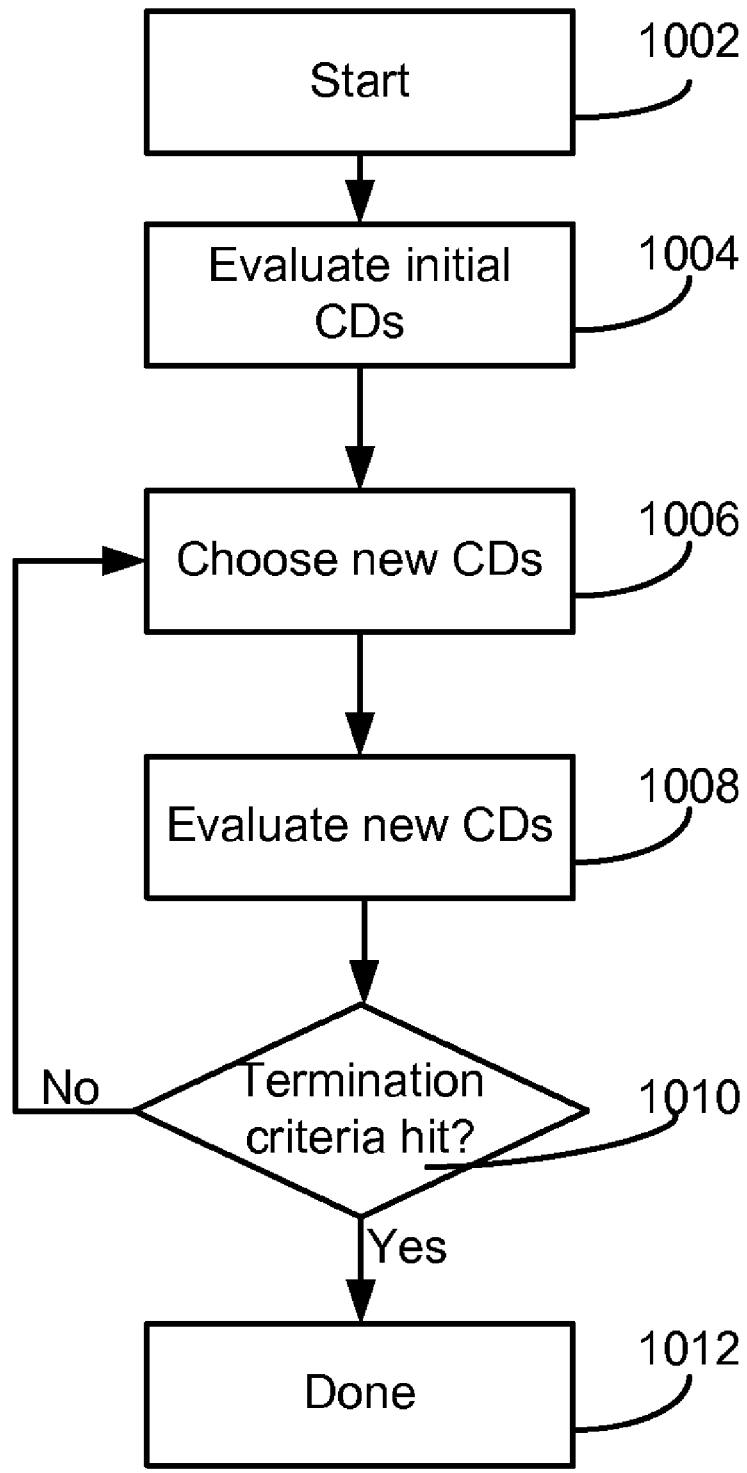
FIG. 10 shows is a general flow for an optimization algorithm.

The following includes descriptions of embodiments of GSO that can be used in the systems and methods described above. FIG. 10 shows the generic flow of an optimization method. The method begins at step 1002 and at step 1004, an initial set of CDs are evaluated. Subsequently, at step 1006, new CDs are obtained and are then evaluated at step 1008. If a termination criteria is attained at step 1010, the method end at step 1012. If not, the step 1010 loops back to step 1006 where new CDs are obtained. Basically, the optimizer is given some initial design(s), which it evaluates. With feedback from past designs, it chooses new designs and evaluates them, repeating until termination criteria is hit. Typical termination criteria are: a maximum number of simulations, maximum runtime, maximum number of designs, and hitting a target performance metric, cost, MPD characteristic, etc. As GSO is an optimizer, it follows the general flow shown at FIG. 10.

An example of GSO, as it relates to global yield optimization of an ECD is described next. Three techniques are used simultaneously to perform global yield optimization on an ECD having hundreds of variables. No simplifying assumptions are made. The first technique is that of a "corners not statistics" approach, the second technique is that of a "structural homotopy" approach, and the third technique is that of a "model-building optimization" that acknowledges uncertainty.

Since analog designers almost always aim for 100% yield, GSO transforms the optimization problem from a stochastic programming problem (e.g., maximize a statistical estimator of yield or Cpk) to a constraint-satisfaction problem (e.g., meet all constraints at multiple process/environmental corners". If those constraints are met then the circuit will get approximately 100% yield. This transformation simplifies the problem and makes it possible to apply a much broader range of optimization techniques to the problem of optimizing (sizing) an ECD. Once GSO solves across all the corners, it can improve further on the ECD by automatically adding more corners at which to optimize. This maximizes the performance margins, or maximize other robustness measures.

GSO is also enabled by an innovation termed structural homotopy. In traditional homotopy, optimization starts on loose versions of the problem, which is subsequently tightened-up (e.g., by application of more stringent performance metric targets) over time to become ever-closer to the true problem at hand. The challenge of traditional homotopy is that it is unclear when to tighten up the problem. Further, it is also sometimes a challenge to identify when a traditional homotopy algorithm has converged. In contrast, structural homotopy embeds loose- to full-versions of the problem into a single data structure and solves for all versions simultaneously. As will be seen in the example of FIG. 11, structural homotopy promotes successful looser solutions into successively harder sub-problems. Finally, finally in the most-loose version of the problem, GSO periodically introduces fully random starting points (CDs). Harder versions of the problem are simply ones with more corners. In this way, whole new design regions can be explored cheaply; more-tested design regions can be refined on many corners; with shades of gray in between. Finally, GSO uses model-building optimization, in which some of the new candidate design points are generated by building a model mapping design variables to performances metrics, cost function, other MPD (ECD) characteristics, etc. Model-building optimization optimizing on the models to choose new candidate points (CDs) based on uncertainty and optimality.

Figure 11:
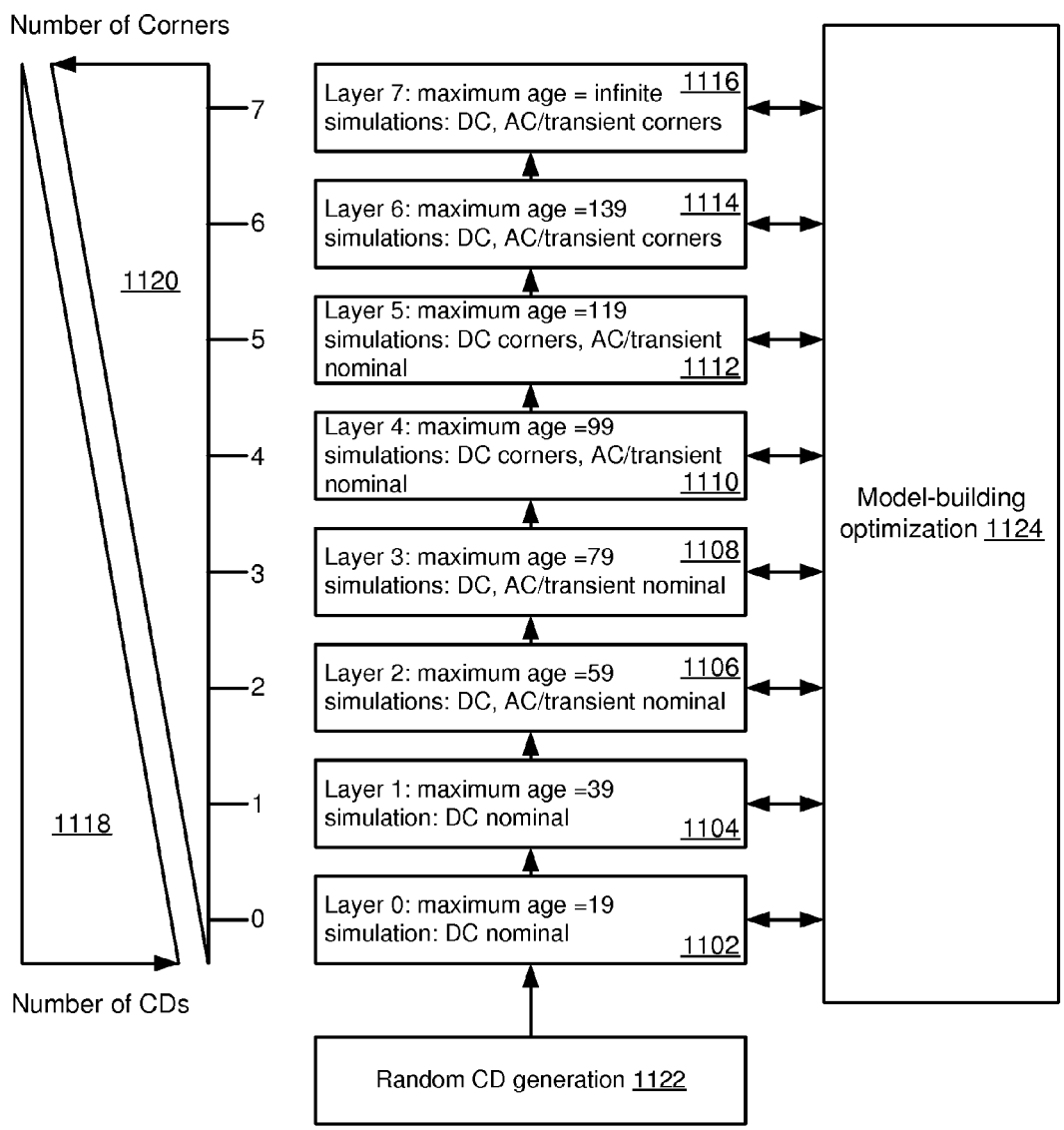
FIG. 11 shows an embodiment of global statistical optimization (GSO) of the present invention, including structural homotopy and model-building optimization'

FIG. 11 shows an exemplary embodiment GSO method that implements the techniques of "corners not statistics", "structural homotopy", and "model-building optimization acknowledging uncertainty" into the structure of a search algorithm. The eight rectangles representing layers 0 through 7, labeled 1102 through 1116, represent eight levels of tightness involved in optimizing and ECD. With increasing layer number, the number of corners at which CD are evaluated is increased; however, the number of CDs evaluated decreases with increasing layer number. This structural homotopy is shown at triangles 1118 and 1120. As such, the computational effort required is substantially the same for each layer. With increasing layer number there can also be additional simulations performed on the CDs. Direct current (DC), alternating current (AC) and transient current (transient) simulations can be performed. "Nominal" as it appears in layers 0 through 5 indicates that the CDs are simulated a only one corner. "Corners", as it appears at layers 6 and 7 indicates that the CD are simulated at multiple corners.

CDs designs in each layer are optimized simultaneously and higher layers can receive CDs from lower layers. At the beginning of the run, there can be randomly-generated CDs in each layer; or there can be just randomly-generated CDs in the lowest layer (layer 0) with all other layers empty, to be filled as the optimization progresses At each iteration of the algorithm, for each layer, CDs in a layer are updated according to the generic flow of FIG. 10. Further, the CDs can be updated in accordance with any suitable algorithm, such as, for example, hillclimbers, tabu search, simulated annealing, evolutionary algorithm, etc. CDs from lower layers can propagate to higher layers, but they cannot go the other direction. That is, higher layer CDs are not available to lower layer CDS. In the exemplary method of FIG. 11, randomly generated CDs, at 1122, are provided to layer 0 and, as such, the GSO method continues exploration. Since randomly generated CDs are only evaluated at nominal, many of them can be evaluated.

At the opposite extreme, designs which have made it to layer 7 get evaluated on all corners and are thus refined, and thoroughly tested. Thus, in the GSO exemplary method of FIG. 11, there is an explicit instantiation of exploration vs. exploitation with loosening on the exploration side at each successive layer lever. That is, there is structural homotopy.

For each of layer 0 through 7, there is a maximum age limit for CDs. The age is the number of iterations that a CD or its predecessors have been around since random generation. If the CDs exceed the maximum age limit they are discarded. This prevents stagnation at a given layer.

Figure 12:
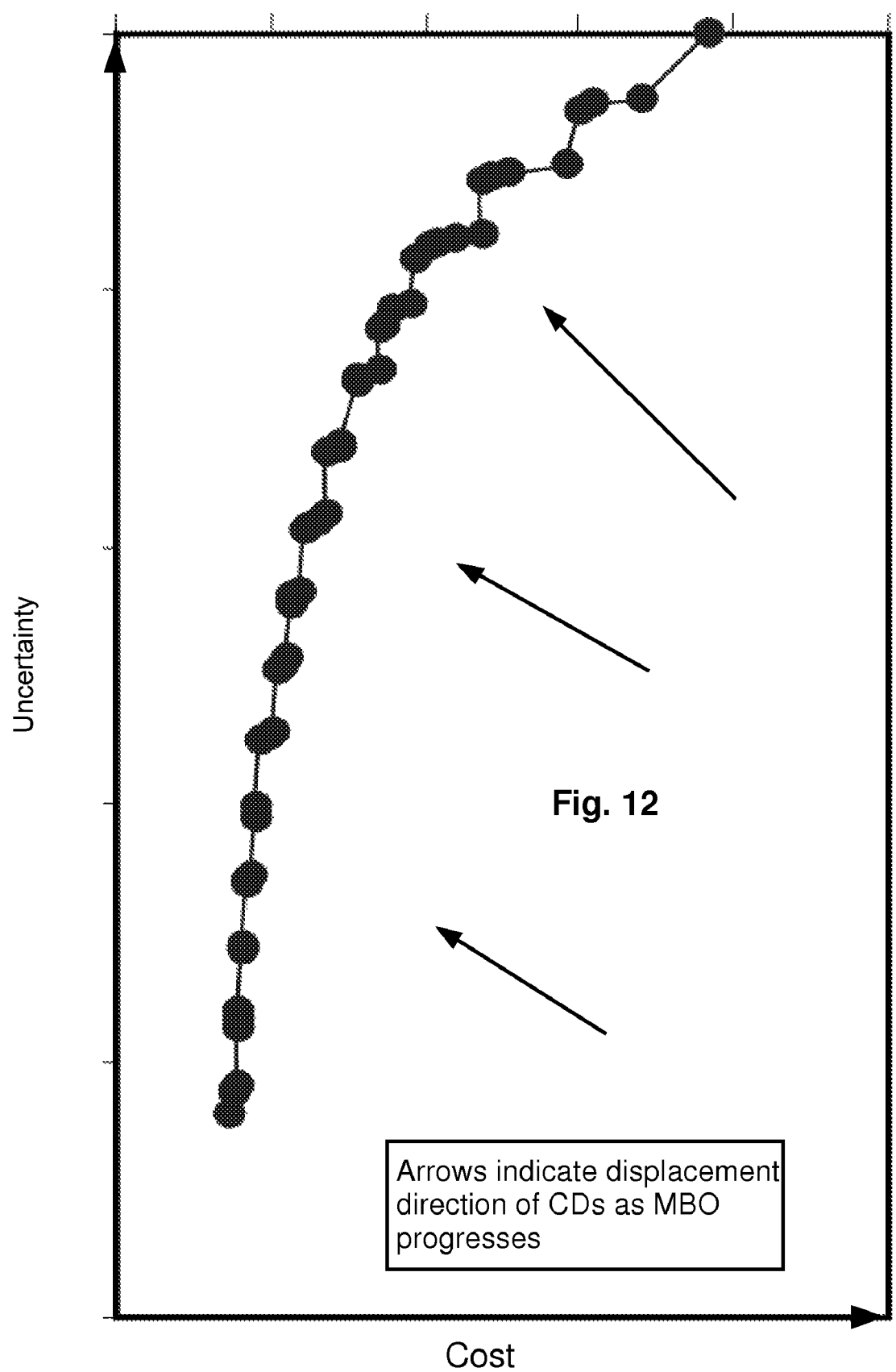
FIG. 12 shown illustrates how multi-objective optimization aims to maximize uncertainty and minimize cost as it progresses (for inner loop of model-building optimization)

To take further advantage of all samples and simulations taken, at every iteration of the algorithm, for each layer, model-building optimization (MBO) 1124 is performed. In MBO, model(s) that map design variables to performance metrics, cost functions, MPD characteristics, etc., are built and then, an inner multi-objective optimization is performed on the models to choose designs that minimize cost on the model, and maximize uncertainty of the model. A generic exemplary output of MBO is shown at FIG. 12. Thus, GSO explicitly explores in regions of high uncertainty and optimality. MBO is described in more details in U.S. patent application Ser. No. 12/237,069, filed Sep. 24, 2008, the content of which in incorporated herein in its entirety. As will be understood by the skilled worker, any other suitable method of searching for CDs with a bias towards optimality and uncertainty can be used without departing from the scope of the present disclosure. As will be further understood by the skilled worker, the GSO method shown at FIG. 11 can be applied to any suitable MPD and there can be any number of layers.

To the inventors' knowledge, the GSO method as described in relation to FIG. 11 is the first example of how to accomplish global stochastic optimization. It is possible that future inventions describe alternative ways to meet the same goals, which can then subsequently be used in GSC and GSD as well. That is, the aspects of GSC and GSD do not depend on the specific implementation of GSO. They only depend on the fact that GSO is actually possible (which is what the GSO method of FIG. 11 shows).

As previously stated, GSC captures and display mappings from design variables to performance across the whole design variables space. Further, GSC can handle hundreds of design variables in a reasonable time (say <1 day) for a reasonable number of simulations (say <100,000). GSC captures design variable interactions and other possible nonlinearities, explicitly capture uncertainties, and intuitively displays them. As such, GSC takes off from where prior art active-learning model-building techniques left off. As mentioned previously, those techniques focus on the regions of highest model uncertainty, but that is not enough to build models which have decent enough accuracy for the user. What GSC adds is a second aim to bias the active learning search more by biasing for optimality (of ECD or MPD performance). After all, the user doesn't care if good models are built in design regions that have poorly-performing circuits. It is this second aim of optimality that is important to biasing enough to get decent accuracy for the user.

In comparison, active learning methods merely sample a design space with uniform bias. Past active-learning methods sample a design space with bias towards uncertainty. The GSC approach of the present disclosure samples a design variables space with bias towards uncertainty and optimality. Interestingly, this is exactly how GSO samples during optimization: as an optimizer, it naturally goes for optimality; and its model-building biases it towards regions of uncertainty. By continually injecting random new designs into its loosest sub-problem (layer 0 in the example of FIG. 11), it ensures a continual space-filling of the whole design space. Finally, the most optimal designs—the ones of most interest to the user—not only have more bias due to optimization but also have more refined estimates of cost due to the more corners in the structural homotopy formulation. GSC builds on GSO by using GSO's samples and simulations. It ensures that models mapping design variables to performances metrics or cost functions, etc., are available to the user. Further, variables sweeps, two-dimensional plots, etc., based on the models, are available for display as well. Relative impacts of different variables on different outputs is also useful. All these plots can be explored by the user interactively.

GSD leverages the new visualizations displayed by GSC within the context of an interactive design environment. The characterization info of GSC can be reframed as "design guidance" information within GSD that gives insight with quick feedback. For example, relative impact of design variables on an MPD, performance metrics as a function of variables, etc., can now be displayed to the designer who thereby gains insight as to which variables to modify, and as by how much to change their values, in order to improve the MPD. GSD effectively closes the design loop by offering to the designer a means to try out new candidate designs, and by quickly providing feedback about them to the designer. Furthermore, GSO running in background can now be reframed as a "design assistant" to the designer by offering useful suggestions. The designer can also suggest design points, design regions, or sweeps to GSO, as shown at FIGS. 13 and 14.

Figure 13:
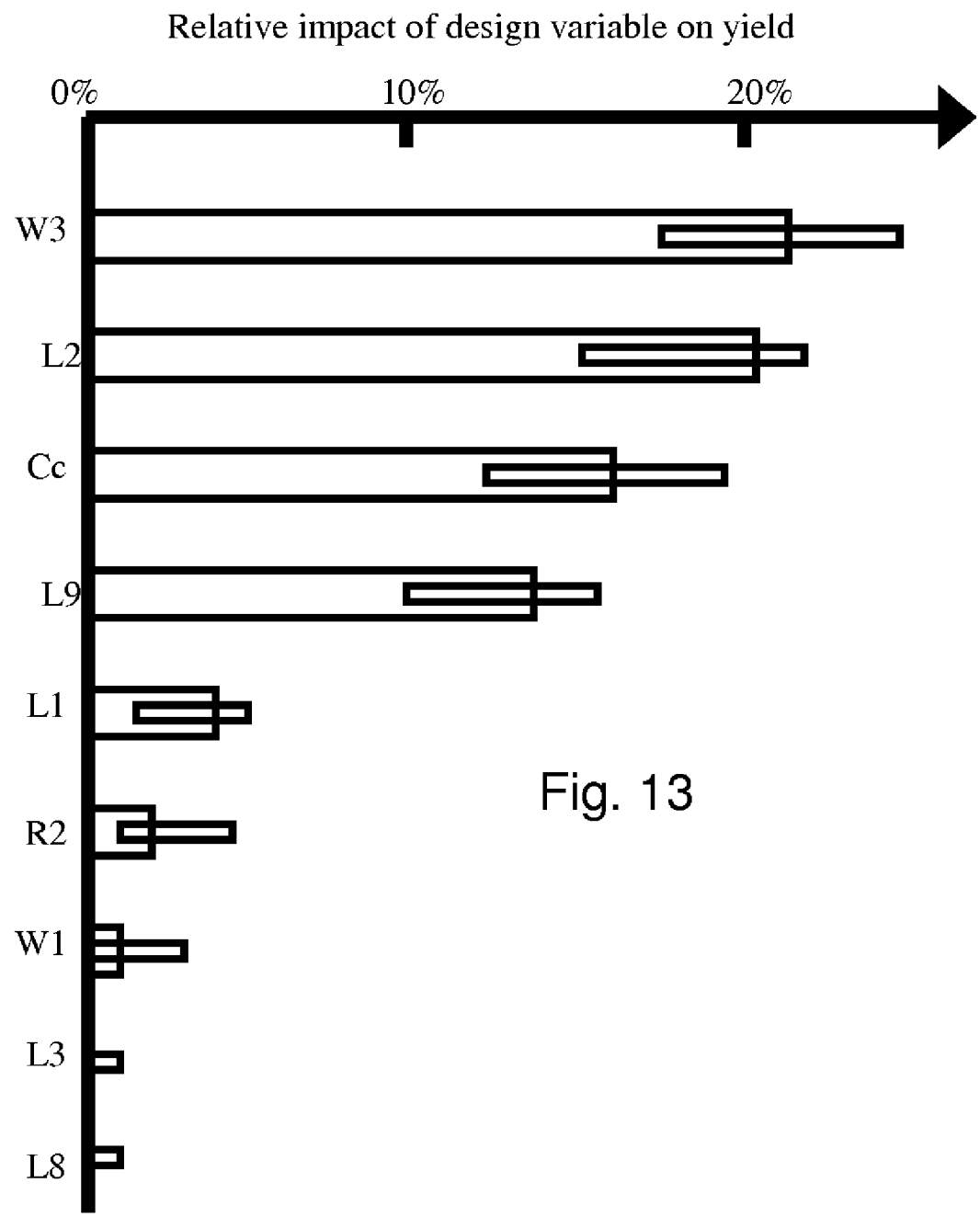
FIGS. 13 and 14 shown an exemplary conceptual usage of the global statistical design tool.

FIG. 13 shows an exemplary plot of information that can be displayed to the designer. The plot of FIG. 13 of relative impact of design variable on yield for an ECD having design variables W3, L2, Cc, L9, L1, R2, W1, L3 and L8. Also shown are the error bars of the relative impact for each design variable. The designer can select any of the design variables to bring up a sweep plot of the relative impact on yield of the variable. This is shown at FIG. 14 in the case where the designer has selected, for example by clicking, the design variable L2. The error of the relative impact of L2 on the yield are also shown as a function of L2. Also shown at FIG. 14 is the current value of L2, which is indicated by the line 1402. The designer can another CD by, for example, clicking and moving the line 1402 to another position in the sweep plot. This causes the newly selected CD to be provided as input to the GSO and can also be used to update the underlying L2 model.

Figure 15:
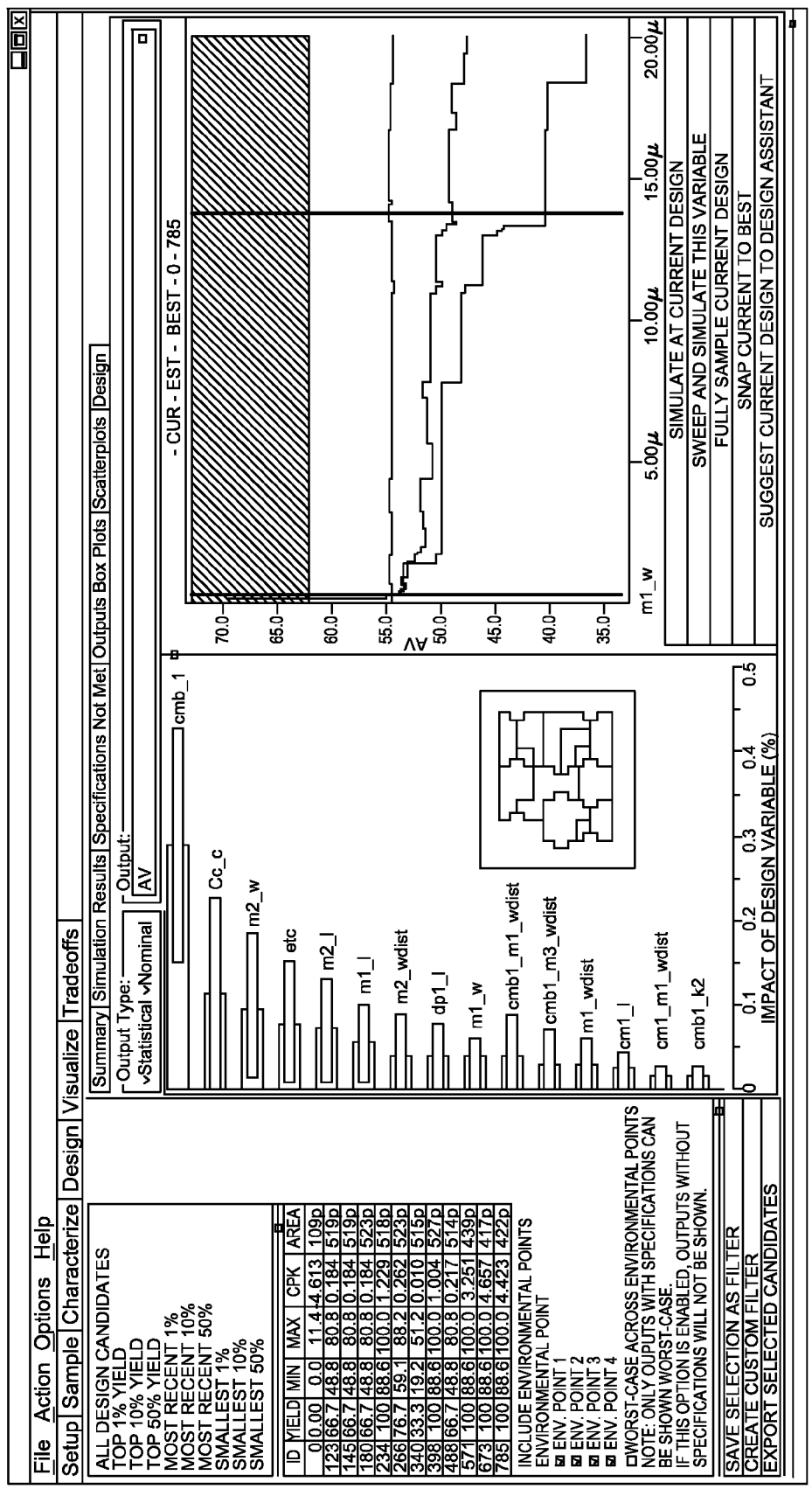
FIG. 15 shown a user interface of global statistical design with a two-dimensional sweep plot.
Figure 16:
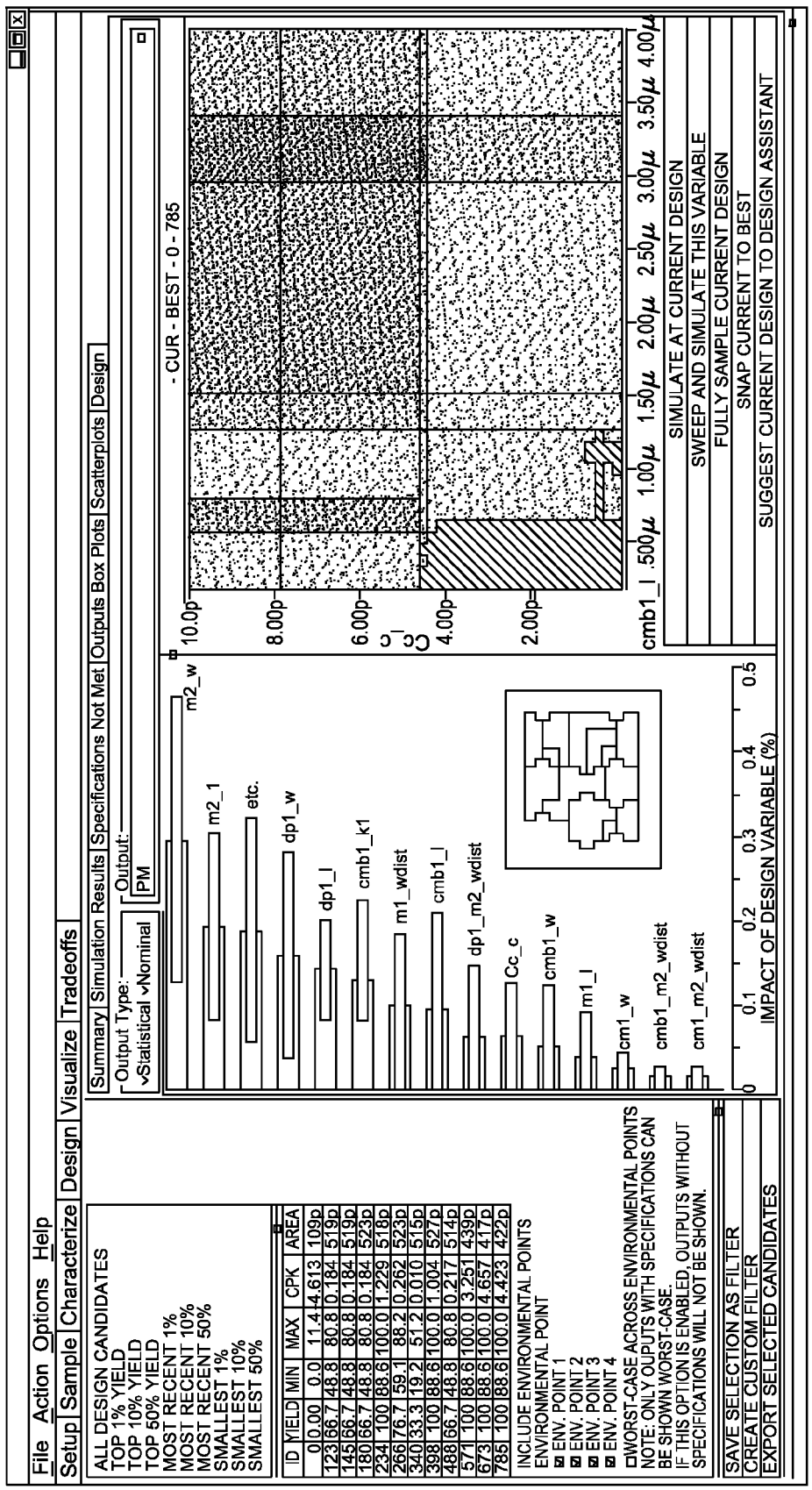
FIG. 16 shows a user interface of global statistical design with a three-dimensional contour plot.

Thus, the user and GSO engage in a collaboration with GSO. This collaboration can even be extended to multiple users simultaneously and/or multiple optimizers running in the background. When a design is chosen from the GSD module, there is a means to quickly send that design's values within the context of a MPD (e.g., and ECD). A database from GSO/GSC can be stored for future use, enabling future designs or design iterations to have a strong start from the baseline data (e.g., the inputs at FIGS. 7-9). FIGS. 15 and 16 are exemplary user interfaces that show a GSD module can perform from an implementation of GSD, for 2d sweep plot and 3d contour plot respectively.

Figure 14:
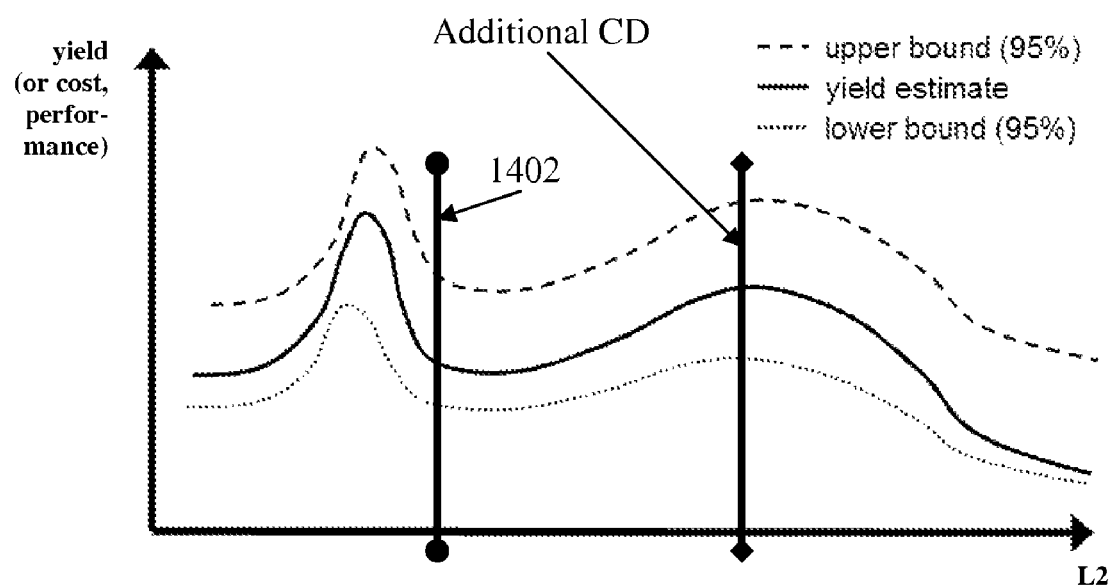

FIG. 15 can be viewed as an implementation of the conceptual view of FIG. 14, as they both have the impact bar plots, and the sweep plot. As GSO proceeds in background, the plots are updated in real-time. Note in the sweep plot of FIG. 15 how the uncertainty is lowest regions of higher, more optimal gain AV (left side of sweep plot), and highest in regions of lower, less optimal AV (right side of sweep plot). This illustrates how GSO has focused on regions of optimality, and therefore has less uncertainty in those regions. And of course the uncertainty continues to tighten as time passes, especially for regions of optimality or where the user has made simulation requests.

For the interface of FIG. 15, the designer can select different variables in many possible ways, such as clicking on a bar corresponding to a variable, or clicking on the devices in the schematic shown at the bottom left of the plot (the device schematics can be expanded). The interface of FIG. 15 present different options to the user such as: (a) simulate at current design (on corners); (b) sweep and simulate this variable; (c) fully (Monte Carlo) sample current design; (d) snap current CD to best (best according to GSO, e.g., lowest cost), and (e) suggest current design to design assistant, in which case the current design gets sent to GSO. These options (3) are fully Monte-Carlo sampled designs, which come from GSO and/or from the user's requests. Also shown at FIG. 15, the user can choose different outputs for the y-axis of the sweep plot (and the impact bars); different performance metrics (AV, power, etc) at nominal process corner and typical environmental corner; worst-case performance metrics across all corners; or cost, which can be based on how much each performance metric violates its constraint(s) and can be viewed as an overall summary of "goodness" of a given CD. The "best" designs are the lowest-cost ones.

Feasible and infeasible regions of design variables space can be distinguished by different colors/shading in the background of the plot (not shown, but the green region is feasible). The bar charts are a useful complement to the sweep plots as their ranking of design variable importance gives the user some guidance as to which variables will be the most fruitful to change. A variation to the interface shown at FIG. 15 could show more than one output at once, e.g. with 3 sweep plots arranged in a vertical column, or with one sweep plots but multiple y-axes and corresponding lines, one for each output.

The interface shown at FIG. 16 has similar behavior to the interface shown at FIG. 15 except that it shows the output response to two design variables simultaneously by showing a 3d contour plot. This is useful because it shows how two design variables can interact for their effect on the output. Another complementary GSD screen could show the optimal tradeoffs between different performances: e.g. if the user has selected two performances then the interface could show a two-dimensional scatterplot of performances similar to that shown at FIG. 12, but for axes such as worst-case power consumption vs. worst-case gain. For three performance metrics, a three-dimensional scatterplot can be shown. For greater than three performance metrics, a radar plot can be shown, where each axis is a performance (or other multidimensional visualization techniques such as parallel coordinates). Interactivity is also possible: the user can filter designs by setting maximum of minimum values of performances; or by manually selecting and deselecting specific designs (CDs) (e.g., clicking a design to toggle, or dragging the mouse across a region). In this fashion a "current design" can be selected, which is then visualized as the "current design" in the 2d sweep plot or 3d contour plot. And vice versa: the "current design" in the other plots can show up here as well. There is also a means to toggle whether to show all designs seen, just nondominated designs seen (i.e., the tradeoff of simulated results), or an approximation of the tradeoff according to the regression models.

As mentioned above, GSD can support a fully manual design flow. An exemplary flow for statistical design at a given block could then be:
1. Understand "goodness" of current design (via Monte Carlo Sampling)
2. Get insight/hints about how to improve the design's yield
3. Generate new design point
4. Understand "predicted goodness" (and uncertainty of prediction) of possible new design
5. Maybe goto step 2 or 3 to continue to improve "predicted goodness"
6. Do MC Sampling of new design to know its true "goodness"
7. Compare "goodness" of original design to new design. If satisfied, stop; else go to 2.

Block-specific tools use the interactive environment of GSD, which is enabled by GSC. But it is applied to smaller circuit blocks, blocks with so few variables that one can apply simpler sampling techniques for the design variables (and other variables), such as full factorial sampling from the design of experiments (DOE) literature. In the most common usage, block-specific tools would have a pre-set database. Once a "block tools" design is selected by the designer, there is a simple means to send its block's values into the context of the larger design. Common blocks like current mirrors and differential pairs could actually have that database generated and stored just once by CAD/modeling support groups, such that the designer never has to generate it. The key attribute of "block-specific tools" is that DOE rather than GSO is used to generate it because of smaller circuits, but that the tools of GSC and GSD are still enabled.

A specific instantiation (an example) of the present invention is described next. It includes user workflow and specific algorithms, with an example on design of an A/D data converter circuit on a 90 nm process. The designer first draws out the schematics for all the blocks and sub-blocks. The top-level block is an A/D converter with 8 two-stage cascode operational amplifier sub-blocks. Each op amp sub-block has 4 cascode current mirror sub-blocks, one differential pair sub-block, and one bias generator sub-block. The designer already has a GSC database for the cascode current mirror, and for the differential pair, which were supplied by his organization's modeling group. But he needs to generate the GSC database for the differential pair; so he does by invoking a "generate GSC database by DOE" command and specifies the differential pair's problem setup.

Under the hood, Latin hypercube sampling (LHS) DOE sampling is performed in design space, with each design point simulated at automatically-determined process and environmental corners. A simulation is performed at each {design point, process point, environmental point}, and the results are stored in the database. Regression models which map {design, process, environmental} variables to performances are automatically generated, and stored to the diff pair's GSC database as well. With the diff pair GSC database complete, the user has GSC databases for all sub-blocks of the op amp. He then opens the schematic of the op amp, selects the devices for a current mirror, and invokes the GSD tool for the current mirror. The GSD screen opens, showing a 3d contour plot of width and length of the devices, for the current mirror's power consumption at the 90 nm process within the operating region determined by the mirror's context in the op amp. A bar plot of the relative impacts of design variables is shown as well as three variables (width, length, multiplier_mirrored_device), and the width and length bars are highlighted.

The designer analyzes the response, and clicks within the three-dimensional contour plot, and therefore changes the values of the length and width. He then clicks on the bar for multiplier_mirrored_device, and a two-dimensional sweep plot of power vs. multiplier_mirrored_device appears. He clicks in the sweep plot to change the value of the multiplier from 1 to 3. The designer decides he is satisfied with the response, so he clicks on a button to close the current mirror GSD. Now the values of the current mirror he has set have been automatically propagated into the op amp's selected current mirror. He repeats this process for the other three current mirrors, the bias generator, and the diff pair. Using the ECD schematic, he manually sets the values of remaining components in the operational amplifier, such as Miller feedback compensation capacitance. He does some simulations at the nominal process point, and typical environmental point, and does some brief tweaking of parameter values. He invokes a Monte Carlo sampling of this initial design, examines the results via some statistical-related visualizations, and decides that this is a satisfactory starting point.

The designer then sets some lower-bound specifications for the op amp's performance, and invokes the GSO tool to optimize the operational amplifier. The GSO tool automatically determines a good set of process/environmental corners to optimize on: for each performance metric, it adds the corner that gives the worst-case performance. The GSO proceeds to optimize using the designer's starting point as an initial hint. At each homotopy level of GSO, simulated annealing heuristics are used to determine new design points based on feedback from past results. (In addition, model-building optimization generates new points). Periodically, GSO updates its database of results to include the most recent simulation data. Also periodically, GSC takes these new simulation results and creates updated regression models mapping performance from the op amp's design variables to the op amp's nominal performances/worst-case performances. If the user's screen is on the GSD, then the plots for the current selected design variable(s) and output(s) will be updated correspondingly by one-dimensional or two-dimensional sweeps across the corresponding updated regression model with other values set to the current design point. If the designer changes the variable(s) or the target output, then once again the plots will be updated. To plot cost, a regression model of cost could be used directly, or it could be computed by simulating other regression models of performance and aggregating into cost. As time is passing, the user sees that the confidence intervals are tightening, and that the "best" designs are becoming better. The designer continues to explore the different mappings, gaining insight as he does so. Periodically, he decides to guide GSO by asking it to "try the current design" which he has set, or by other related buttons. As time goes on, GSO returns designs with improved yield. Eventually, it returns a design that reports 100% yield (with a lower-bound 95%-confidence of 96.5%). The user decides to tighten the specifications for AV and for the power supply rejection ratio PSRR, so he does; GSO automatically adapts its search to improve these more; and the GSD screens update their yield estimates and feasibility plotting. In due time, the designer, with GSO, achieves a design having 100% yield on the tighter specifications. The user is satisfied with this, so he stops the GSO run. All the GSC regression models are automatically updated to ensure they contain all simulation data.

In all, the run to optimize the amplifier and generate its GSC database took a few hours. Now, the designer will aim to design the overall A/D converter. So he opens up the schematic for the A/D, which includes 8 op amps represented as conceptual op amp symbols. He selects the first op amp, and invokes the GSD tool for the selected op amp. It opens up the GSD tool for the op amp database he just generated, showing the op amp at bias and load settings appropriate to the context of the op amp. He goes to the tradeoffs screen, and selects a design that is a good all-around performer—on the "knee" of the tradeoff curve: AV not the best but not the worst, power not the best but not the worst, etc. This will make a reasonable design for most of the op amps in the A/D, so he chooses to "export design to all cases" which sets this op amp's design values to each op amp in the A/D. He closes the GSD tool having the op amp database, to go back to the schematic for the A/D. He selects the last op amp, opens the GSD tool for it, and using the tradeoffs tool selects a slightly different design than before, one with slightly more stability and gain. He closes the GSD for the op amp. He sets initial values for the remaining components in the A/D. Now he has an initial design for his A/D. Then, such as in design at the op amp level, the designer does some nominal simulations and design variable tweaking, then invokes a Monte Carlo sampling. He then sets some lower-bound specifications for the A/D's performance, and invokes the GSO tool to optimize the operational amplifier. In this instantiation, GSO's design variables include the actual device sizes in each op amp, but GSO is heavily constrained because each op amp's combination of device sizes should satisfy the performance constraints of the op amp GSC model.

To speed up simulation, each op amp's device sizes predict its performances, and those performances are inputs to op amp behavioral models. Thus, the A/D's design space is large, but heavily constrained by cheap constraints; and simulation time is mitigated by the behavioral models. GSO optimization of the A/D continues; and GSC databases are generated with corresponding GUI updates, and the user continues to use GSD to explore the mappings. The designer can toggle between exploring the mappings from all device sizes to A/D performances, or mappings from op amp specifications to A/D performances (because those models can be built on-the-fly as well). The advantage of the former approach is that it gives a direct mapping from lowest-level variables to highest-level performance metrics, which can be useful for detailed insight. The advantage of the latter approach is that it pulls the abstractions to just the highest level of the hierarchy. As time progresses, the A/D performance improves and eventually the user with GSO have hit a yield of 100% according to the A/D specifications. The user runs it a little longer to improve the margin of performances compared to specifications. Then he stops GSO, and runs a full Monte Carlo sampling on the final design at the transistor level (i.e., without behavioral models). He is satisfied with the A/D performance, so he is done. He saves the design, as well as the GSC database for the A/D.

As will be understood by the skilled worker, there is flexibility in the choice of independent design variables. The most obvious is to use device sizes as directly as possible, with sharing of values for blocks like current mirrors. A variation is to use ratios of width/length or width*multiplier/length to replace either a width, length, or multiplier design variable. Another variation is to use an "operating-point driven formulation" in which the independent design variables tend to be based on the transistor operating points, such as overdrive voltage, Vgs, Vds, and bias current. In all variations, there needs to be a means to ultimately compute the actual device sizes from the independent design variables.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine-readable medium may interface with circuitry to perform the described tasks.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method to optimize a multi-parameter design (MPD) having design variables and performance metrics, the method comprising steps of:
  a) calculating, at a first set of design corners, by using a computer, a performance value of each performance metric for each candidate design of a first set of candidate designs, each performance metric being a function of at least one of the design variables, the design variables defining a design variables space, the MPD having associated thereto the first set of candidate designs, random variables, defining a random variables space, and environmental variables, defining an environmental variables space, the random variables space and the environmental variables space defining design corners at which the candidate designs can be evaluated, each candidate design representing a combination of design variables;
  b) calculating, for each performance value, by using the computer, a performance value uncertainty, the performance value of each performance metric for each candidate design of the first set of candidate designs, and its respective performance value uncertainty, defining a first set of data;
  c) in accordance with the first set of data, building a model of each performance metric to obtain a first set of models, each model mapping at least one design variable to a model output and to a model output uncertainty;
  d) storing the first set of models in a characterization database;
  e) displaying, for selection, one or more models of the first set of models, and their model uncertainty;
  f) in response to a selection of one or more candidate designs, which defines selected candidate designs, and in accordance with the one or more displayed models:
    i) adding the selected candidate designs to the first set of candidate designs, to obtain a second set of candidate designs;
    ii) calculating, at a second set of design corners, a performance value, and a performance value uncertainty, for each performance metric of each selected candidate design;

iii) adding the performance value and the performance value uncertainty of the selected candidate designs to the first set of data, to obtain a second set of data;

iv) in accordance with the second set of data, modifying the model of each performance metric, to obtain a second set of models, each having a modified model uncertainty;

v) displaying, for inspection, one or more models of the second set of models;

vi) in accordance with the second set of candidate designs, and in accordance with pre-determined search rules, generating additional candidate designs by performing a search of the design variables space, the search being biased towards optimality and uncertainty of the performance metrics;

vii) adding the additional candidate designs to the second set of candidate designs, to obtain a third set of candidate designs;

viii) calculating, at a third set of design corners, a performance value, and a performance value uncertainty, for each performance metric of each additional candidate design;

ix) adding the performance value and the performance value uncertainty of the additional candidate designs to the second set of data, to obtain a third set of data; and x) in accordance with the third set of data, modifying the model of each performance metric and the model uncertainty of each model, to obtain a third set models;

and g) displaying, for inspection, one or more models of the third set of models.

2. The method of claim 1 further comprising a step of generating random candidate designs, and wherein the step of generating additional candidate designs is also in accordance with the random candidate designs.

3. The method of claim 1 wherein performing the search of the design variables space includes performing an automated optimization of the performance metrics in the design variables space, the optimization being performed in accordance with pre-determined optimization criteria.

4. The method of claim 3 wherein the automated optimization includes optimizing a cost function, the cost function depending on at least one of the performance metrics, the pre-determined optimization criteria including an optimum cost function value.

5. The method of claim 3 wherein performing the automated optimization includes steps of forming an active learning model (ALM) for each performance metric, and performing a multi-objective optimization in accordance with the ALMs, objectives of the multi-objective optimization are functions of the models' performance metric values and of the models' uncertainties in performance metric values.

6. The method of claim 1 wherein at least one of the first set of models, the second set of models, and the third set of models includes at least one regressor.

7. The method of claim 6 wherein the at least one regressor includes at least one of: ensembles of linear models, ensembles of polynomials, ensembles of piecewise polynomials, ensembles of splines, ensembles of feedforward neural networks, ensembles of support vectors, ensembles of kernel-based machines, ensembles of classification and regression trees, and ensembles of density estimations.

8. The method of claim 1 wherein displaying the one or more models of the first, second or third sets of models and their related uncertainty includes displaying the one or more models of the first set of models and their related uncertainty in a graphical form or in a text form.

9. The method of claim 8 wherein the graphical form includes a two-dimensional plot of a performance metric model, and its related uncertainty, as a function of a design variable.

10. The method of claim 8 wherein displaying one or more models of the first, second and third sets of models is a graphical plot of one design variable versus a second design variable versus a performance metric model's value.

11. The method of claim 10 wherein the graphical plot includes at least one of a contour map and a three-dimensional surface plot.

12. The method of claim 11 further comprising steps of:
identifying within a graph, designs that meet performance constraints; and identifying within the same graph, designs that fail to meet performance constraints.

13. The method of claim 9 wherein the related uncertainty includes a lower confidence bound and an upper confidence bound.

14. The method of claim 1 further comprising steps of:
calculating an impact of a portion of the design variables on a characteristic of the MPD, in accordance with any one of the first, second and third set of data; and
displaying the impact of the portion of the design variables on the characteristic.

15. The method of claim 14 wherein the characteristic is a manufacturing yield of the MPD.

16. The method of claim 1 wherein calculating at any one of the first, second, and third set of design corners includes automatically simulating the MPD at the respective set of design corners.

17. A method to optimize a multi-parameter design (MPD) having design variables and performance metrics, the method comprising steps of:
a) calculating, at a first set of design corners, by using a computer, a performance value of each performance metric for each candidate design of a first set of candidate designs, each performance metric being a function of at least one of the design variables, the design variables defining a design variables space, the MPD having associated thereto the first set of candidate designs, random variables, defining a random variables space, and environmental variables, defining an environmental variables space, the random variables space and the environmental variables space defining design corners at which the candidate designs can be evaluated, each candidate design representing a combination of design variables;
b) calculating, for each performance value, by using the computer, a performance value uncertainty, the performance value of each performance metric for each candidate design of the first set of candidate designs, and its respective performance value uncertainty, defining a first set of data;
c) in accordance with the first set of data, building a model of each performance metric to obtain a first set of models, each model mapping at least one design variable to a model output and to a model output uncertainty;
d) storing the first set of models in a characterization database;
e) displaying, for selection, one or more models of the first set of models, and their model uncertainty; and
f) in response to a selection of one or more candidate designs, which defines selected candidate designs, and in accordance with the one or more displayed models:

i) adding the selected candidate designs to the first set of candidate designs, to obtain a second set of candidate designs;
ii) calculating, at a second set of design corners, a performance value, and a performance value uncertainty, for each performance metric of each selected candidate design;
iii) adding the performance value and the, performance value uncertainty of the selected candidate designs to the first set of data, to obtain a second set of data;
iv) in accordance with the second set of data, modifying the model of each performance metric, to obtain a second set of models, each having a modified model uncertainty; and
v) displaying, for inspection, one or more models of the second set of models.

18. A non-transitory computer readable medium having recorded thereon statements and instructions for execution by a computer to carry out a method to optimize a multi-parameter design (MPD) having design variables and performance metrics, the method comprising steps of:

a) calculating, at a first set of design corners, a performance value of each performance metric for each candidate design of a first set of candidate designs, each performance metric being a function of at least one of the design variables, the design variables defining a design variables space, the MPD having associated thereto the first set of candidate designs, random variables, defining an random variables space, and environmental variables, defining an environmental variables space, the random variables space and the environmental variables space defining design corners at which the candidate designs can be evaluated, each candidate design representing a combination of design variables;
b) calculating, for each performance value, a performance value uncertainty, the performance value of each performance metric for each candidate design of the first set of candidate designs, and its respective performance value uncertainty, defining a first set of data;
c) in accordance with the first set of data, building a model of each performance metric to obtain a first set of models, each model mapping at least one design variable to a model output and to a model output uncertainty;
d) storing the first set of models in a characterization database;
e) displaying, for selection, one or more models of the first set of models, and their model uncertainty;
f) in response to a selection of one or more candidate designs, which defines selected candidate designs, and in accordance with the one or more displayed models:
   i) adding the selected candidate designs to the first set of candidate designs, to obtain a second set of candidate designs;
   ii) calculating, at a second set of design corners, a performance value, and a performance value uncertainty, for each performance metric of each selected candidate design;
   iii) adding the performance value and the, performance value uncertainty of the selected candidate designs to the first set of data, to obtain a second set of data;
   iv) in accordance with the second set of data, modifying the model of each performance metric, to obtain a second set of models, each having a modified model uncertainty;
   v) displaying, for inspection, one or more models of the second set of models;
   vi) in accordance with the second set of candidate designs, and in accordance with pre-determined search rules, generating additional candidate designs by performing a search of the design variables space, the search being biased towards optimality and uncertainty of the performance metrics;
   vii) adding the additional candidate designs to the second set of candidate designs, to obtain a third set of candidate designs;
   viii) calculating, at a third set of design corners, a performance value, and a performance value uncertainty, for each performance metric of each additional candidate design;
   ix) adding the performance value and the performance value uncertainty of the additional candidate designs to the second set of data, to obtain a third set of data; and
   x) in accordance with the third set of data, modifying the model of each performance metric and the model uncertainty of each model, to obtain a third set models;
and
g) displaying, for inspection, one or more models of the third set of models.

* * * * *

UNITED STATES PATENT AND TRADEMARK OFFICE
CERTIFICATE OF CORRECTION

PATENT NO. : 8,024,682 B2  Page 1 of 1
APPLICATION NO. : 12/396972
DATED : September 20, 2011
INVENTOR(S) : McConaghy et al.

It is certified that error appears in the above-identified patent and that said Letters Patent is hereby corrected as shown below:

ON THE TITLE PAGE:

Item (75) Inventors, at line 7, "Jiangdon" should read -- Jiandong --

Signed and Sealed this
Twenty-second Day of November, 2011

David J. Kappos
*Director of the United States Patent and Trademark Office*